(12) United States Patent
Bower et al.

(10) Patent No.: US 11,374,086 B2
(45) Date of Patent: Jun. 28, 2022

(54) DEVICES WITH A SINGLE METAL LAYER

(71) Applicant: X Display Company Technology Limited, Dublin (IE)

(72) Inventors: Christopher Bower, Raleigh, NC (US); Matthew Meitl, Durham, NC (US); Carl Prevatte, Raleigh, NC (US); Ronald S. Cok, Rochester, NY (US)

(73) Assignee: X Display Company Technology Limited, Dublin (IE)

( * ) Notice: Subject to any disclaimer, the term of this patent is extended or adjusted under 35 U.S.C. 154(b) by 0 days.

(21) Appl. No.: 17/405,323

(22) Filed: Aug. 18, 2021

(65) Prior Publication Data

US 2021/0384290 A1 Dec. 9, 2021

Related U.S. Application Data

(63) Continuation of application No. 16/579,386, filed on Sep. 23, 2019, now Pat. No. 11,127,812, which is a (Continued)

(51) Int. Cl.
*H01L 27/32* (2006.01)
*H01L 27/15* (2006.01)
(Continued)

(52) U.S. Cl.
CPC ...... *H01L 27/3288* (2013.01); *H01L 25/0753* (2013.01); *H01L 27/14636* (2013.01);
(Continued)

(58) Field of Classification Search
CPC .... G06F 3/0445; G06F 3/0446; G06F 3/0443; G06F 3/0412; G06F 3/044; G06F 3/0448;
(Continued)

(56) References Cited

U.S. PATENT DOCUMENTS

| 5,550,066 A | 8/1996 | Tang et al. |
| 5,621,555 A | 4/1997 | Park |

(Continued)

FOREIGN PATENT DOCUMENTS

| WO | WO-2015/193434 A2 | 12/2015 |
| WO | WO-2016/030422 A1 | 3/2016 |

(Continued)

OTHER PUBLICATIONS

Bower, C. A. et al., Transfer Printing: An Approach for Massively Parallel Assembly of Microscale Devices, IEEE, Electronic Components and Technology Conference, (2008).

(Continued)

*Primary Examiner* — Dong Hui Liang
(74) *Attorney, Agent, or Firm* — Choate, Hall & Stewart LLP; Michael D. Schmitt

(57) ABSTRACT

A single metal layer device, such as a display or sensor, comprises a substrate and a patterned metal layer. The patterned metal layer forms a two-dimensional array of spatially separated column line segments that each extend only partially across the display substrate in a column direction and forms a one-dimensional array of row lines extending across the display substrate in a row direction different from the column direction. The row lines and column line segments are electrically separate in the patterned metal layer. Spatially separated electrical jumpers are disposed on the display substrate and electrically connect pairs of column line segments adjacent in the column direction. Each electrical jumper has an independent jumper substrate independent of and separate from the display substrate. In certain embodiments, spatially separated light-emitting pixel circuits are disposed on a display substrate and are electrically connected to at least one row line and one column line.

20 Claims, 22 Drawing Sheets

US 11,374,086 B2
Page 2

Related U.S. Application Data continuation of application No. 15/659,500, filed on Jul. 25, 2017, now Pat. No. 10,475,876.

(60) Provisional application No. 62/366,945, filed on Jul. 26, 2016.

(51) Int. Cl.
  *H01L 27/146* (2006.01)
  *H01L 25/075* (2006.01)
  *H01L 33/62* (2010.01)

(52) U.S. Cl.
  CPC ........ *H01L 27/156* (2013.01); *H01L 27/3211* (2013.01); *H01L 27/3255* (2013.01); *H01L 27/3276* (2013.01); *H01L 33/62* (2013.01); *H01L 2933/0066* (2013.01)

(58) Field of Classification Search
  CPC ............ G06F 3/041; G06F 3/047; G06F 2203/04103; G06F 2203/04112; G06F 2203/04111; G06F 2203/04102; G06F 2203/04101; G06F 2203/04108; G06F 2203/04106; G06F 1/16; G06F 1/13338; H01L 27/323; H01L 27/14636; H01L 27/14643; H01L 27/14609; H01L 27/14689; H01L 27/14625; H01L 51/56; H01L 25/0753; H01L 21/67259
  See application file for complete search history.

(56) References Cited

U.S. PATENT DOCUMENTS

| | | |
|---|---|---|
| 6,084,579 A | 7/2000 | Hirano |
| 6,142,358 A | 11/2000 | Cohn et al. |
| 6,184,477 B1 | 2/2001 | Tanahashi |
| 6,403,985 B1 | 6/2002 | Fan et al. |
| 6,717,560 B2 | 4/2004 | Cok et al. |
| 7,195,733 B2 | 3/2007 | Rogers et al. |
| 7,354,801 B2 | 4/2008 | Sugiyama et al. |
| 7,417,648 B2 | 8/2008 | Credelle |
| 7,521,292 B2 | 4/2009 | Rogers et al. |
| 7,557,367 B2 | 7/2009 | Rogers et al. |
| 7,586,497 B2 | 9/2009 | Boroson et al. |
| 7,629,955 B2 | 12/2009 | Asao et al. |
| 7,662,545 B2 | 2/2010 | Nuzzo et al. |
| 7,687,812 B2 | 3/2010 | Louwsma et al. |
| 7,704,684 B2 | 4/2010 | Rogers et al. |
| 7,799,699 B2 | 9/2010 | Nuzzo et al. |
| 7,932,123 B2 | 4/2011 | Rogers et al. |
| 7,943,491 B2 | 5/2011 | Nuzzo et al. |
| 7,999,454 B2 | 8/2011 | Winters et al. |
| 8,470,701 B2 | 6/2013 | Rogers et al. |
| 8,558,243 B2 | 10/2013 | Bibl et al. |
| 8,619,011 B2 | 12/2013 | Kimura |
| 8,791,474 B1 | 7/2014 | Bibl et al. |
| 8,794,501 B2 | 8/2014 | Bibl et al. |
| 8,803,857 B2 | 8/2014 | Cok |
| 8,835,940 B2 | 9/2014 | Hu et al. |
| 8,865,489 B2 | 10/2014 | Rogers et al. |
| 8,884,844 B2 | 11/2014 | Yang et al. |
| 8,889,485 B2 | 11/2014 | Bower |
| 8,896,505 B2 | 11/2014 | Cok et al. |
| 8,941,215 B2 | 1/2015 | Hu et al. |
| 8,987,765 B2 | 3/2015 | Bibl et al. |
| 9,105,714 B2 | 8/2015 | Hu et al. |
| 9,111,464 B2 | 8/2015 | Bibl et al. |
| 9,153,171 B2 | 10/2015 | Sakariya et al. |
| 9,161,448 B2 | 10/2015 | Menard et al. |
| 9,166,114 B2 | 10/2015 | Hu et al. |
| 9,178,123 B2 | 11/2015 | Sakariya et al. |
| 9,217,541 B2 | 12/2015 | Bathurst et al. |
| 9,240,397 B2 | 1/2016 | Bibl et al. |
| 9,252,375 B2 | 2/2016 | Bibl et al. |
| 9,367,094 B2 | 6/2016 | Bibl et al. |
| 9,412,727 B2 | 8/2016 | Menard et al. |
| 9,437,782 B2 | 9/2016 | Bower et al. |
| 9,444,015 B2 | 9/2016 | Bower et al. |
| 9,478,583 B2 | 10/2016 | Hu et al. |
| 9,484,504 B2 | 11/2016 | Bibl et al. |
| 9,520,537 B2 | 12/2016 | Bower et al. |
| 9,555,644 B2 | 1/2017 | Rogers et al. |
| 9,583,533 B2 | 2/2017 | Hu et al. |
| 9,626,908 B2 | 4/2017 | Sakariya et al. |
| 9,698,308 B2 | 7/2017 | Bower et al. |
| 9,705,042 B2 | 7/2017 | Bower et al. |
| 9,765,934 B2 | 9/2017 | Rogers et al. |
| 9,860,955 B2 | 1/2018 | Kim et al. |
| 9,865,832 B2 | 1/2018 | Bibl et al. |
| 10,475,876 B2 | 11/2019 | Bower et al. |
| 2002/0075440 A1 | 6/2002 | Deane |
| 2002/0096994 A1 | 7/2002 | Iwafuchi et al. |
| 2002/0175882 A1 | 11/2002 | Edwards et al. |
| 2004/0046500 A1 | 3/2004 | Stegamat |
| 2005/0264472 A1 | 12/2005 | Rast |
| 2007/0040770 A1 | 2/2007 | Kim |
| 2008/0012794 A1 | 1/2008 | Battersby |
| 2008/0018583 A1 | 1/2008 | Knapp et al. |
| 2008/0266214 A1 | 10/2008 | Naugler et al. |
| 2008/0303756 A1 | 12/2008 | Smith |
| 2009/0121988 A1 | 5/2009 | Amo et al. |
| 2009/0250690 A1 | 10/2009 | Shin et al. |
| 2010/0002180 A1 | 1/2010 | Kim et al. |
| 2010/0123694 A1 | 5/2010 | Cok et al. |
| 2010/0186883 A1 | 7/2010 | Tomoda |
| 2011/0032277 A1 | 2/2011 | Lee et al. |
| 2011/0073864 A1 | 3/2011 | Liu et al. |
| 2011/0254804 A1* | 10/2011 | Kuo ..................... G06F 3/0418 345/174 |
| 2012/0062135 A1 | 3/2012 | Tamaki et al. |
| 2012/0126233 A1 | 5/2012 | Chang et al. |
| 2012/0206428 A1 | 8/2012 | Cok |
| 2012/0223875 A1 | 9/2012 | Lau et al. |
| 2013/0088416 A1 | 4/2013 | Smith et al. |
| 2013/0229400 A1 | 9/2013 | Kim et al. |
| 2013/0273695 A1 | 10/2013 | Menard et al. |
| 2014/0082934 A1 | 3/2014 | Cok |
| 2014/0085214 A1 | 3/2014 | Cok |
| 2014/0111442 A1 | 4/2014 | Cok et al. |
| 2014/0131715 A1 | 5/2014 | LIU et al. |
| 2014/0159043 A1 | 6/2014 | Sakariya et al. |
| 2014/0224635 A1* | 8/2014 | Chang .................... H01H 11/00 200/600 |
| 2014/0240617 A1 | 8/2014 | Fukutome et al. |
| 2014/0267683 A1 | 9/2014 | Bibi et al. |
| 2014/0319486 A1 | 10/2014 | Hong |
| 2015/0135525 A1 | 5/2015 | Bower |
| 2015/0296580 A1 | 10/2015 | Kim et al. |
| 2015/0362165 A1 | 12/2015 | Chu et al. |
| 2015/0371585 A1 | 12/2015 | Bower et al. |
| 2015/0371974 A1 | 12/2015 | Bower et al. |
| 2015/0372051 A1 | 12/2015 | Bower et al. |
| 2015/0372052 A1 | 12/2015 | Bower et al. |
| 2015/0372053 A1 | 12/2015 | Bower et al. |
| 2015/0372393 A1 | 12/2015 | Bower et al. |
| 2016/0005721 A1 | 1/2016 | Bower et al. |
| 2016/0018094 A1 | 1/2016 | Bower et al. |
| 2016/0093600 A1 | 3/2016 | Bower et al. |
| 2016/0266697 A1 | 9/2016 | Cheng et al. |
| 2016/0290600 A1 | 10/2016 | Biederman et al. |
| 2016/0343772 A1 | 11/2016 | Bower et al. |
| 2017/0025075 A1 | 1/2017 | Cok et al. |
| 2017/0048976 A1 | 2/2017 | Prevatte et al. |
| 2017/0068362 A1 | 3/2017 | Den Boer et al. |
| 2017/0102797 A1 | 4/2017 | Cok |
| 2017/0167703 A1 | 6/2017 | Cok |
| 2017/0177105 A1 | 6/2017 | Wu et al. |
| 2017/0186740 A1 | 6/2017 | Cok et al. |
| 2017/0187976 A1 | 6/2017 | Cok |
| 2017/0256521 A1 | 9/2017 | Cok et al. |
| 2017/0256522 A1 | 9/2017 | Cok et al. |
| 2017/0338374 A1 | 11/2017 | Zou et al. |
| 2017/0357127 A1 | 12/2017 | Cok et al. |

(56) References Cited

U.S. PATENT DOCUMENTS

| 2018/0199402 | A1 | 7/2018 | Henninger |
| 2018/0219142 | A1 | 8/2018 | Chen et al. |
| 2018/0269234 | A1 | 9/2018 | Hughes et al. |
| 2019/0333901 | A1 | 10/2019 | Cok et al. |
| 2020/0051482 | A1 | 2/2020 | Cok et al. |

FOREIGN PATENT DOCUMENTS

| WO | WO-2017/060487 A2 | 4/2017 |
| WO | WO-2017/149067 A1 | 9/2017 |

OTHER PUBLICATIONS

Cok, R. S. et al., 60.3: AMOLED Displays Using Transfer-Printed Integrated Circuits, Society for Information Display, 10:902-904, (2010).

Cok, R. S. et al., Inorganic light-emitting diode displays using micro-transfer printing, Journal of the SID, 25(10):589-609, (2017).

Cok, R. S. et al., AMOLED displays with transfer-printed integrated circuits, Journal of SID, 19(4):335—341, (2011).

Feng, X. et al., Competing Fracture in Kinetically Controlled Transfer Printing, Langmuir, 23(25):12555-12560, (2007).

Gent, A.N., Adhesion and Strength of Viscoelastic Solids. Is There a Relationship between Adhesion and Bulk Properties, American Chemical Society, Langmuir, 12(19):4492-4496, (1996).

Hamer, J. W. et al., 63.2: AMOLED Displays Using Transfer-Printed Integrated Circuits, SID 09 DIGEST, 40(2):947-950 (2009).

Kim, Dae-Hyeong et al., Optimized Structural Designs for Stretchable Silicon Integrated Circuits, Small, 5(24):2841-2847, (2009).

Kim, Dae-Hyeong et al., Stretchable and Foldable Silicon Integrated Circuits, Science, 320:507-511, (2008).

Kim, S et al., Microstructural elastomeric surfaces with reversible adhesion and examples of their use in deterministic assembly by transfer printing, PNAS, 107(40):17095-17100 (2010).

Kim, T. et al., Kinetically controlled, adhesiveless transfer printing using microstructured stamps, Applied Physics Letters, 94(11):113502-1-113502-3, (2009).

Meitl, M. A. et al., Transfer printing by kinetic control of adhesion to an elastomeric stamp, Nature Material, 5:33-38, (2006).

Michel, B. et al., Printing meets lithography: Soft approaches to high-resolution patterning, J. Res. & Dev. 45(5):697-708, (2001).

Trindade, A.J. et al., Precision transfer printing of ultra-thin AlInGaN micron-size light-emitting diodes, Crown, pp. 217-218, (2012).

Yoon, J. et al., Heterogeneously Integrated Optoelectronic Devices Enabled by MicroTransfer Printing, Adv. Optical Mater., 3:1313-1335 (2015).

\* cited by examiner

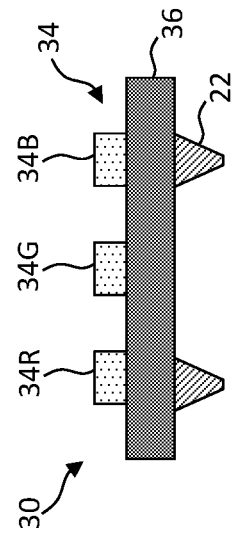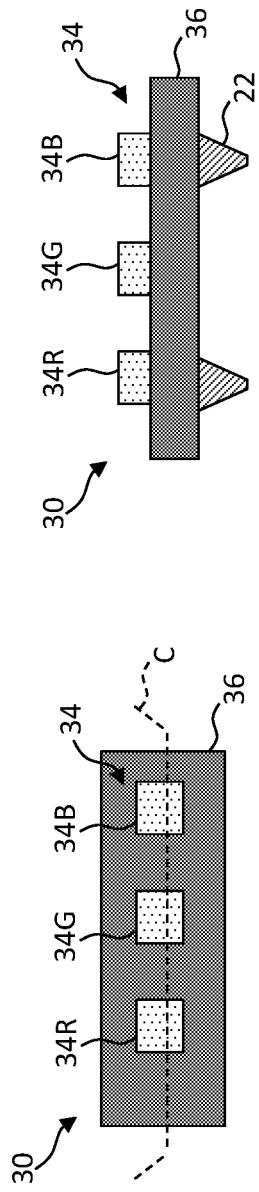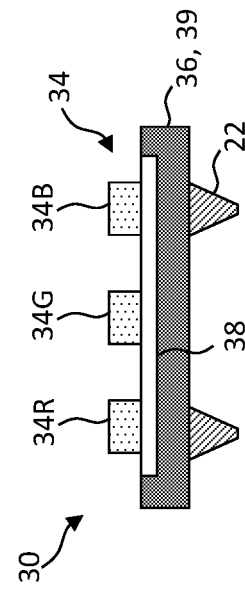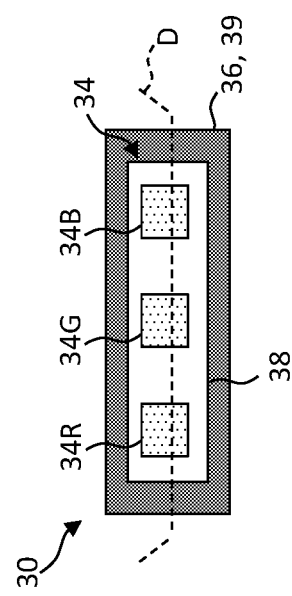

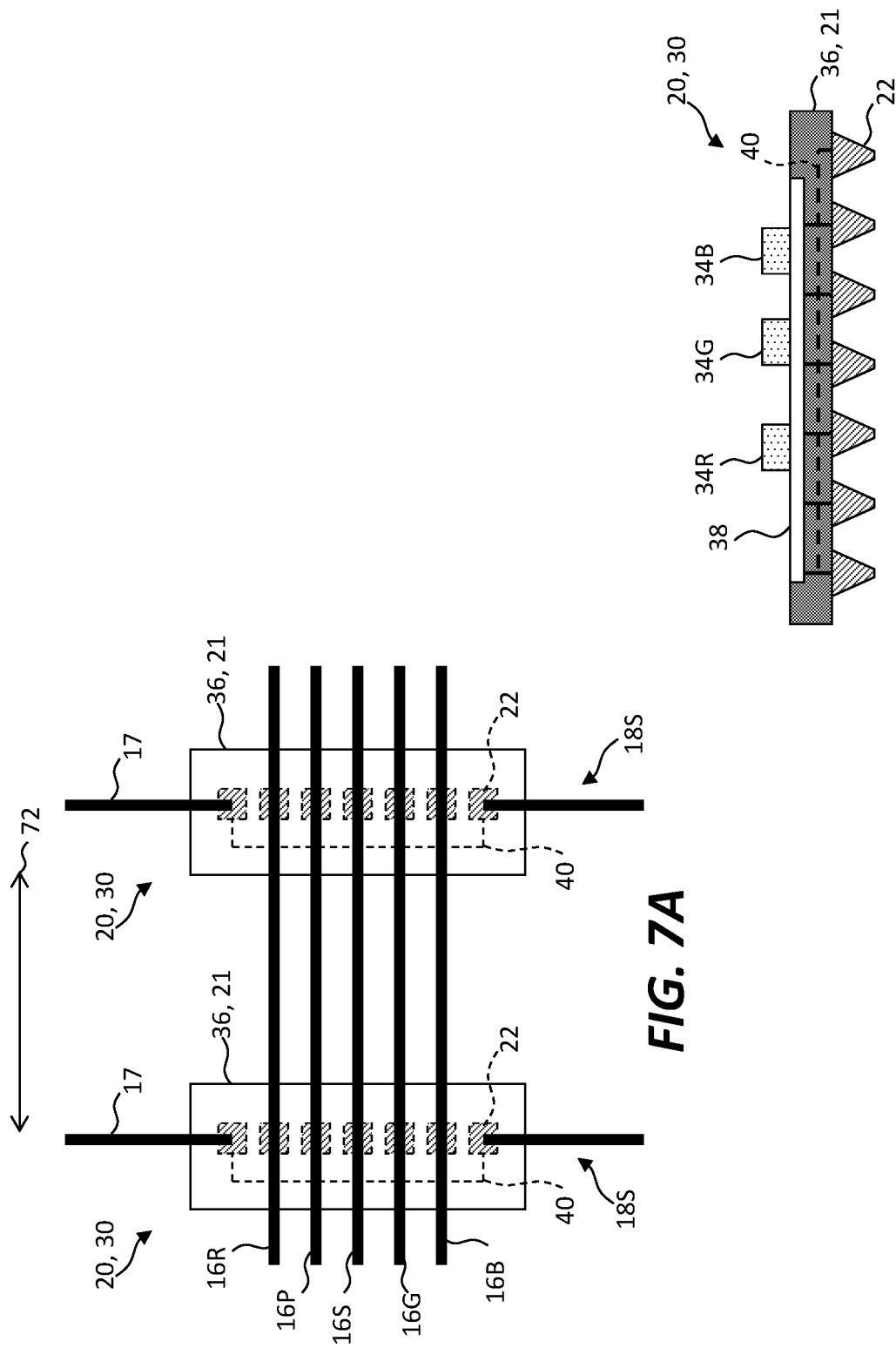

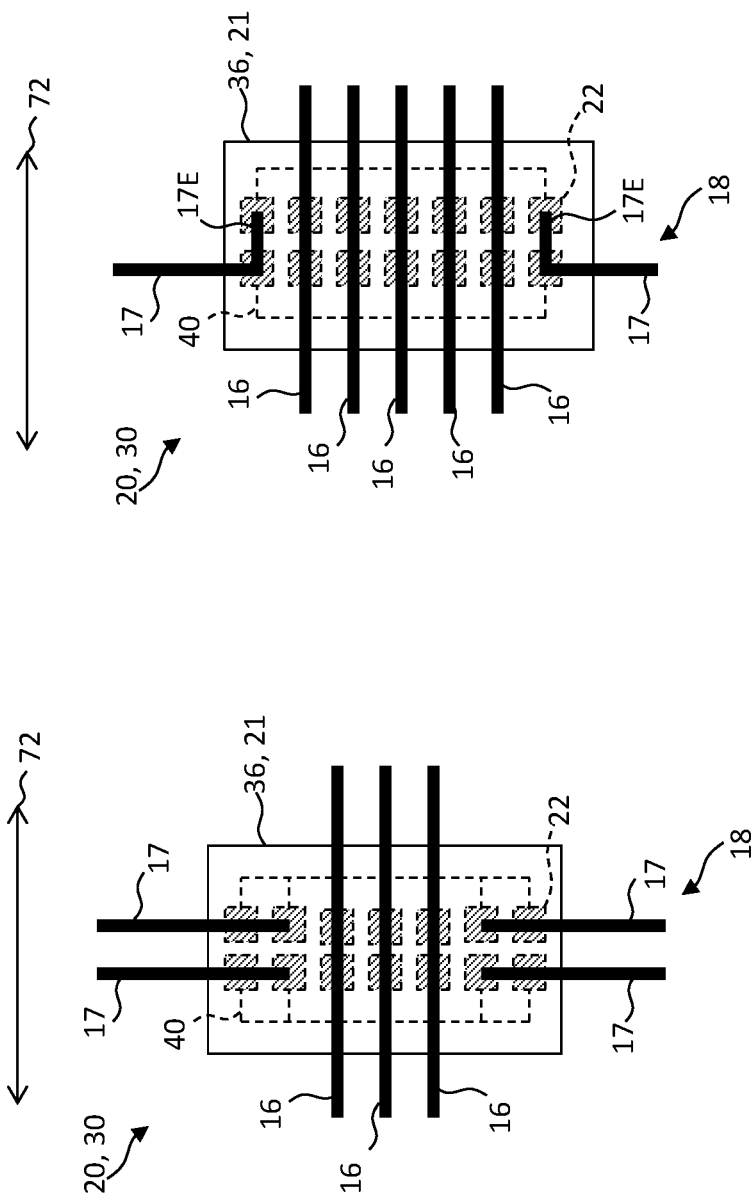

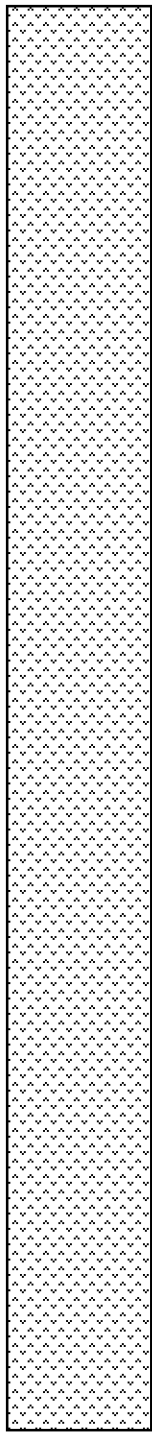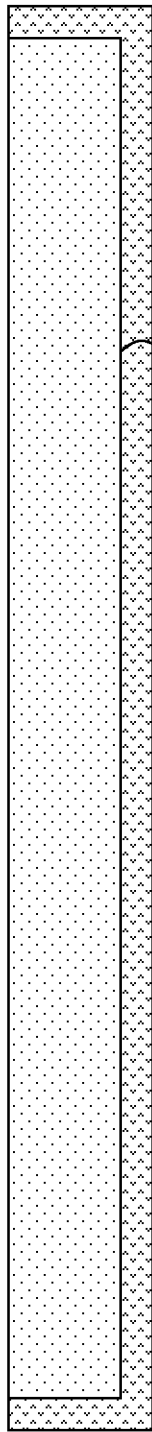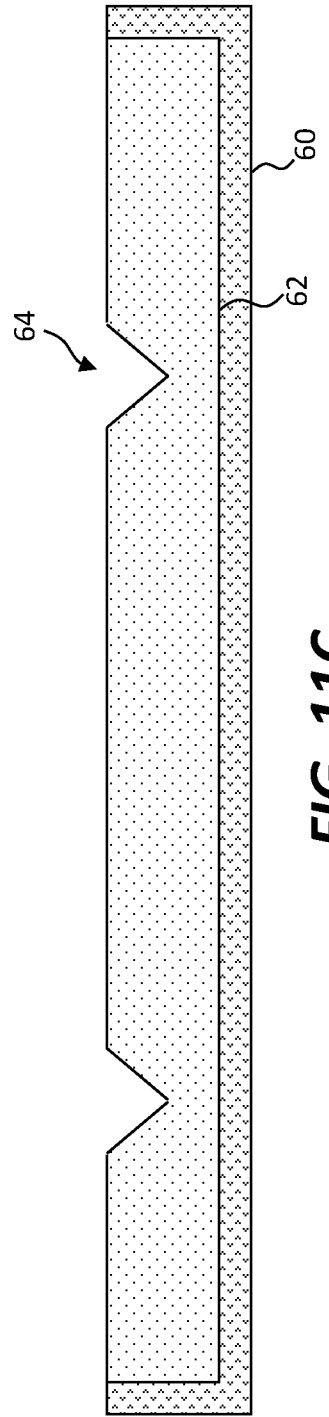
FIG. 11A
FIG. 11B
FIG. 11C

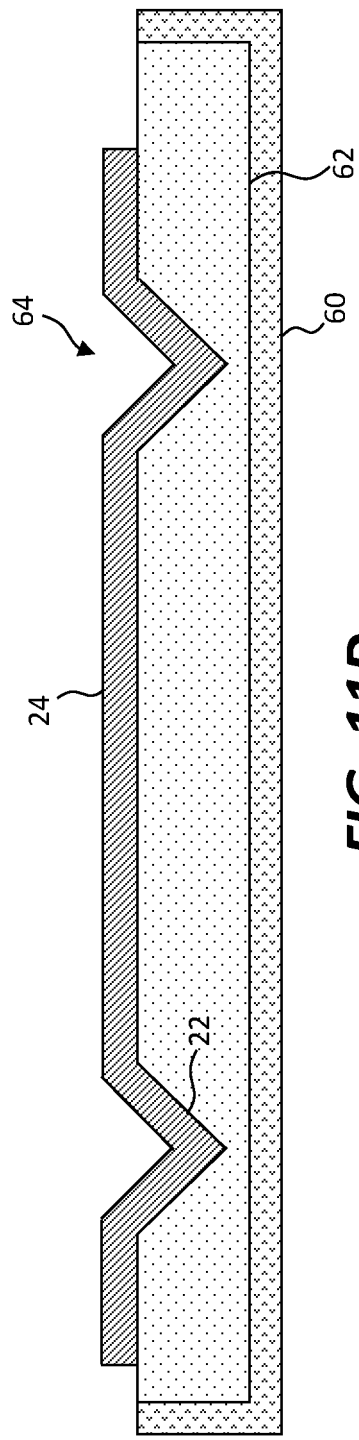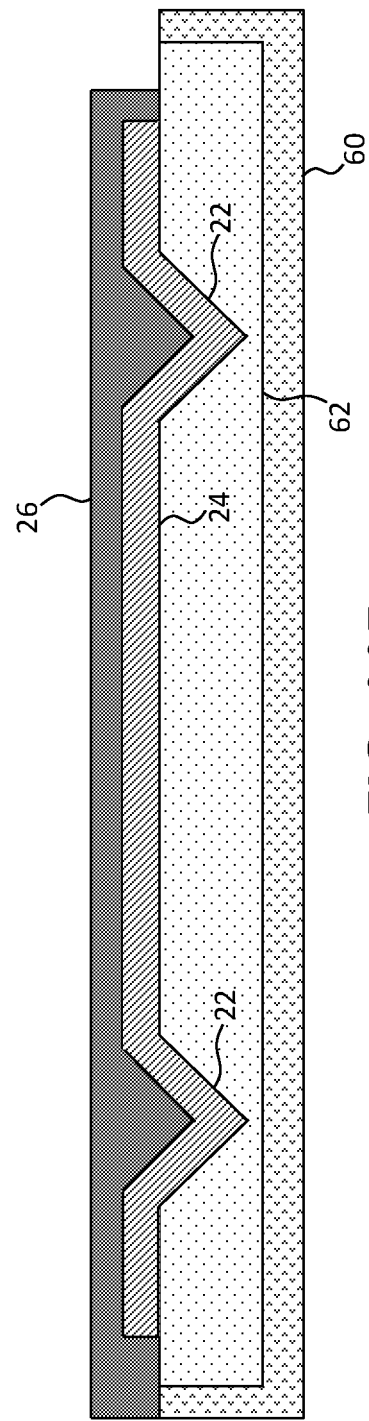

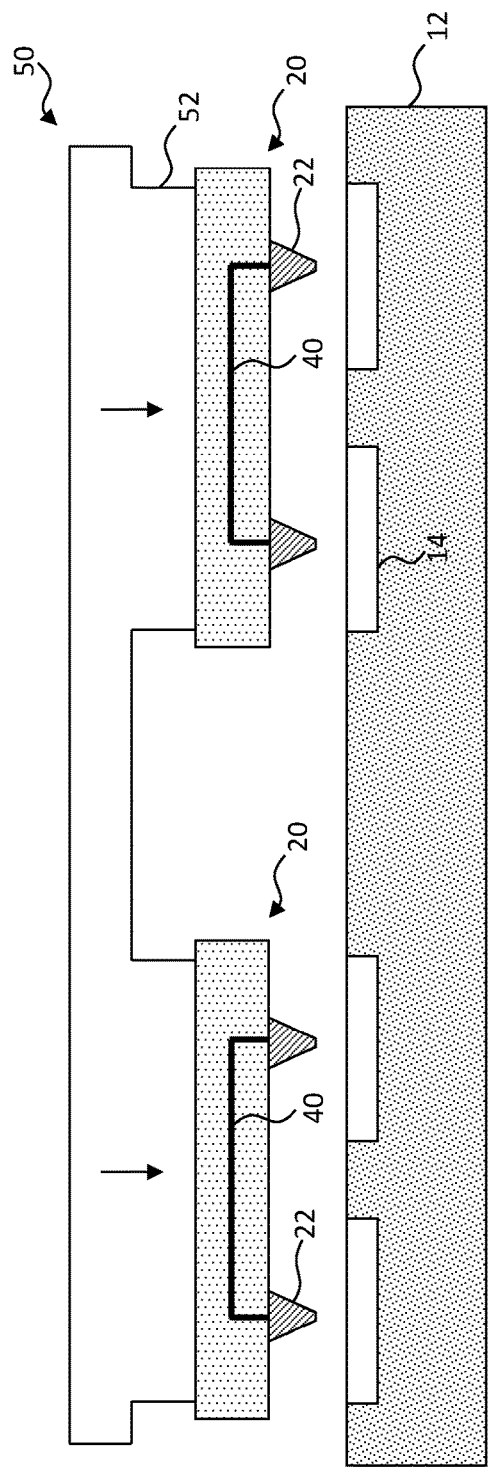
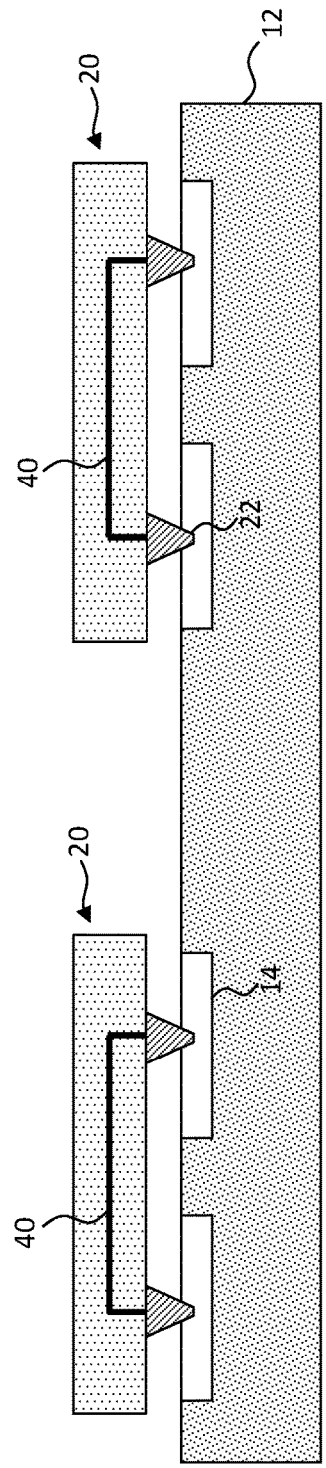

DEVICES WITH A SINGLE METAL LAYER

PRIORITY APPLICATIONS

This application is a continuation of U.S. patent application Ser. No. 16/579,386, filed on Sep. 23, 2019, entitled Devices with a Single Metal Layer, which is a continuation of U.S. patent application Ser. No. 15/659,500, filed on Jul. 25, 2017, entitled Devices with a Single Metal Layer, which claims the benefit of U.S. Provisional Patent Application No. 62/366,945, filed Jul. 26, 2016, entitled Single Metal Layer Display, the disclosure of each of which is hereby incorporated by reference in its entirety.

FIELD OF THE INVENTION

The present invention relates generally to devices, such as displays and sensors, with substrates having a reduced number of photolithographically defined layers.

BACKGROUND OF THE INVENTION

Flat-panel displays are widely used in conjunction with computing devices, in mobile devices, and for entertainment devices such as televisions. Such displays typically employ an array of pixels distributed over a display substrate to display images, graphics, or text. In a color display, each pixel includes light emitters that emit light of different colors, such as red, green, and blue.

Flat-panel display substrates are manufactured using photolithographic processes to define conductive wires and thin-film circuits on the display substrate. Typically, the thin-film circuits control the pixels in the array and a matrix-addressing scheme is used to address the pixels with controllers external to the pixel array. The matrix-addressing scheme generally has row lines arranged across the display substrate in a row direction and column lines arranged across the display substrate in a column direction orthogonal to the row direction. One of the row lines is used to select a row of pixels while the column lines, in parallel, provide data to each of the pixels in the selected row (or vice versa).

The row and column lines must be electrically separate to properly select a row of pixels and provide individual pixel values to each of the pixels in the rows. To maintain electrical isolation between the row and column lines, the row lines are typically formed in a separate layer on or over the display substrate from the column lines. Vias are provided as necessary to enable electrical connections to any row or column lines.

The formation of patterned electrical conductors in a display substrate layer requires multiple photolithographic steps, such as blanket coating the display substrate with a metal layer, blanket coating a photoresist over the metal layer, exposing the photoresist to patterned illumination through a mask to pattern-wise cure the photoresist, developing the photoresist, etching the exposed pattern of metal, and removing the photoresist. Additional planarization layers can be performed and vias through such layers constructed using further photolithographic steps.

Photolithographic processing, although well understood and widely employed in the display industry, is expensive, particular for very large displays (e.g., having a two-meter or larger diagonal) across which very tight tolerances (e.g. within several microns) must be maintained.

Electrical jumpers are known in the electronics industry and typically refers to a short length of electrical conductor used to close, open, or bypass portions of an electrical circuit with exposed jumper pins or contact points on a printed circuit board. Such jumpers typically have a size of a few millimeters and are used to configure or set up printed circuit boards. Jumpers are generally installed by hand or with robotic assembly. Similarly, dual-in-line packages (DIP) switches provide a comparable function with switches and are generally operable by humans. In consequence, such electronic interconnection devices are limited in number and, especially, size on a typical substrate.

There remains a need, therefore, for devices, such as displays, having simplified structures that are easier to make with fewer steps at a lower cost.

SUMMARY OF THE INVENTION

The present invention provides, inter alia, single metal layer displays. Such flat-panel displays can have a display substrate with a single photolithographically patterned metal layer to provide all of the display control signals. The display substrate has a display surface with a display area and a patterned metal layer disposed in or on the display substrate in the display area. The patterned metal layer is at least partially exposed on the display surface.

The patterned metal layer forms a two-dimensional array of spatially separated column line segments in the display area. Each column line segment extends only partially across the display area in a column direction. The patterned metal layer also forms a one-dimensional array of row lines extending across the display area in a row direction different from the column direction. The row lines and column line segments are electrically separate in the patterned metal layer and at least partially in the display substrate area.

In certain embodiments, a plurality of spatially separated electrical jumpers is disposed in the display area on the display surface. Each electrical jumper is electrically connected to two column line segments adjacent in the column direction and thereby electrically connects the adjacent column line segments and forms a one-dimensional array of electrically continuous column lines extending across the display area in the column direction. Each electrical jumper has an independent jumper substrate independent of and separate from the display substrate and independent of and separate from the jumper substrate of any other electrical jumper.

In certain embodiments, a plurality of spatially separated pixel circuits is disposed in the display area on the display surface. Each pixel circuit is electrically connected to at least one row line of an array of row lines and one column line of an array of electrically continuous column lines.

In some embodiments of the present invention, each pixel circuit comprises one or more light-emitting diodes (LEDs) that emit light, for example inorganic LEDs or organic LEDs.

In some embodiments of the present invention, the pixel circuits are passive circuits and the single metal layer display is a passive-matrix display. In another embodiment, the pixel circuits are active circuits that each include at least one transistor and the single metal layer display is an active-matrix display.

In some embodiments of the present invention, each pixel circuit comprises two or more light emitters that each emit a different color of light, for example each pixel circuit comprises a red light emitter that emits red light, a green light emitter that emits green light, and a blue light emitter that emits blue light.

In some embodiments of the present invention, each electrical jumper comprises at least first and second connection posts protruding from the jumper substrate. The first connection post is in electrical contact with a first column line segment and the second connection post in electrical contact with a second column line segment adjacent to the first column line segment in the column direction.

In some embodiments of the present invention, each pixel circuit comprises an independent pixel substrate different from the display substrate and different from the pixel substrate of any other pixel circuit. Each pixel circuit can include one or more light emitters that are disposed on the pixel substrate. The pixel substrate can be a semiconductor substrate such as a silicon substrate, the pixel circuit can include a control circuit, and the control circuit can be native to the silicon substrate. Alternatively, the pixel substrate can be a non-semiconductor substrate such as glass or plastic.

In some embodiments of the present invention, each pixel circuit comprises a silicon substrate different from the display substrate, different from the pixel substrate of any other pixel circuit, and different from the silicon substrate of any other pixel circuit. The pixel circuit can include a control circuit native to the silicon substrate and the silicon substrate can be disposed on the pixel substrate.

In some embodiments of the present invention, the pixel circuit comprises at least first and second wires formed in or on the pixel substrate. Each silicon substrate comprises at least first and second connection posts. The first connection post is in electrical contact with the first wire and the second connection post is in contact with the second wire.

In certain embodiments, the pixel circuit comprises at least first and second wires formed on or in the pixel substrate and one or more LEDs. Each LED comprises a light-emitting structure electrically connected to at least first and second connection posts. The first connection post is in electrical contact with the first wire and the second connection post is in contact with the second wire.

In some embodiments, each pixel substrate comprises at least row and column connection posts. The row connection post is in electrical contact with a row conductor and the column connection post is in contact with a column conductor segment.

In some embodiments of the present invention, the pixel substrate and the jumper substrate are the same substrate. Thus, the pixel circuit and electrical jumper are formed in a common device on a common substrate.

In some embodiments of the present invention, the patterned metal layer forms a plurality of one-dimensional arrays of row lines extending across the display area in the row direction and each pixel circuit is connected to one row line of each of the one-dimensional arrays of row lines. The row lines of one of the arrays of row lines can be signal lines, the row lines of one of the arrays of row lines can be power lines, the row lines of one of the arrays of row lines can be ground lines, the row lines of one of the arrays of row lines can be signal lines and the row lines of another, different one of the arrays of row lines can also be signal lines, or any combination thereof.

In some embodiments of the present invention, the patterned metal layer forms a plurality of two-dimensional arrays of spatially separated column lines extending across the display area in the column direction. The pixel circuit is connected to one column line of each of the one-dimensional arrays of column lines. The column lines of one of the arrays of column lines can be signal lines, the column lines of one of the arrays of column lines can be power lines, the column lines of one of the arrays of column lines can be ground lines, the column lines of one of the arrays of column lines can be signal lines and the column lines of another, different one of the arrays of column lines can also be signal lines, or any combination thereof.

In some embodiments of the present invention, a micro-transfer printable circuit comprises a pixel substrate having a pixel circuit with three or more electrical connections. At least two of the electrical connections are directly electrically connected to form an electrical jumper and at least two of the electrical connections cause the pixel circuit to emit light. At least two of the electrical connections that cause the pixel circuit to emit light can also be one of the electrical connections that are directly electrically connected to form an electrical jumper. Each electrical connection can comprise a connection post protruding from the pixel substrate.

In certain embodiments, methods of making a single metal layer display include providing a display substrate having a patterned metal layer as described above, providing a plurality of electrical jumpers on a jumper source wafer, each electrical jumper having an independent and separate jumper substrate different from the display substrate and different from the jumper substrate of any other electrical jumper, and micro-transfer printing the jumper substrates onto the display substrate and interconnecting the electrical jumpers so that each electrical jumper is electrically connected to two column line segments adjacent in the column direction to electrically connect the adjacent column line segments and form a one-dimensional array of electrically continuous column lines extending across the display area in the column direction.

In certain embodiments, a plurality of pixel circuits is provided on a circuit source substrate, each pixel circuit having an independent and separate pixel substrate different from the display substrate and different from the pixel substrate of any other pixel circuits. The pixel substrates are micro-transfer printed onto the display substrate and interconnected so that each pixel circuit is electrically connected to at least one row conductor and one column conductor.

In some embodiments of methods of the present invention, the step of micro-transfer printing the jumper substrate interconnects the electrical jumpers so that each electrical jumper is electrically connected to two column line segments adjacent in the column direction to electrically connect the adjacent column line segments. In some embodiments of methods, an LED source wafer is provided and LEDs are micro-transfer printed from the LED source wafer onto the pixel substrate. In yet another method, a control circuit is provided in each of a plurality of silicon substrates in a silicon source wafer and the silicon substrates are micro-transfer printed from the silicon source wafer onto the pixel substrate.

In certain embodiments, each of the inorganic micro light-emitting diodes has a width from 2 to 5 µm, 5 to 10 µm, 10 to 20 µm, or 20 to 50 µm, a length from 2 to 5 µm, 5 to 10 µm, 10 to 20 µm, or 20 to 50 µm, or a height from 2 to 5 µm, 4 to 10 µm, 10 to 20 µm, or 20 to 50 µm. In certain embodiments, a resolution of the single metal layer display is 120×90, 1440×1080, 1920×1080, 1280×720, 3840×2160, 7680×4320, or 15360×8640.

In certain embodiments, the display substrate has a thickness from 5 to 10 microns, 10 to 50 microns, 50 to 100 microns, 100 to 200 microns, 200 to 500 microns, 0.5 to 1 mm, 1 mm to 5 mm, 5 mm to 10 mm, or 10 mm to 20 mm. In certain embodiments, the display substrate is a member selected from the group consisting of polymer, plastic, resin, polyimide, PEN, PET, metal, metal foil, glass, a semiconductor, and sapphire. In certain embodiments, the display substrate has a transparency greater than or equal to 50%, 80%, 90%, or 95% for visible light.

In certain embodiments, the display area is a contiguous display area that comprises light-emitting diodes, each light-emitting diode has a light-emissive area, and the combined light-emissive areas of the plurality of light-emitting diodes is less than or equal to one-quarter of the contiguous display substrate area. In certain embodiments, combined light-emissive areas of the light-emitting diodes is less than or equal to one eighth, one tenth, one twentieth, one fiftieth, one hundredth, one five-hundredth, one thousandth, one two-thousandth, or one ten-thousandth of the contiguous display substrate area.

In certain embodiments, the pixel circuits form a regular array on the display substrate in the display area. In certain embodiments, each pixel circuit comprises a single light emitter. In certain embodiments, each pixel circuit comprises at least three light emitters, each of the at least three light emitters emitting light of different colors, for example red, green, or blue. In certain embodiments, each color of light emitters in the pixel circuits form a regular array on the display substrate in the display area.

In certain embodiments, the single-metal-layer display comprises a plurality of pixel circuits each including a pixel substrate (e.g., separate from the display substrate) disposed on the display substrate and one or more light emitters disposed on the pixel substrate. In some embodiments, the pixel circuit on the pixel substrate comprises fine interconnections of a relatively high resolution having a width of 100 nm to 1 μm electrically connected to the light emitters of the respective pixel circuit.

In certain embodiments, one or more conductive wires on the display substrate electrically connects two or more of the pixel circuits. In certain embodiments, the one or more conductive wires conduct signals for controlling the light emitters in the pixel circuits, for conducting power to the pixel circuits, or for providing a ground reference voltage to the pixel circuits. In an embodiment, the conductive wires on the display substrate comprises coarse interconnections of a relatively low resolution having a width from 2 μm to 2 mm, wherein each coarse interconnection is electrically connected to at least one of the pixel circuits on the display substrate.

In certain embodiments, the plurality of light emitters emits light through the display substrate. In other embodiment, the plurality of light emitters emits light in a direction opposite the display substrate.

In certain embodiments, the present disclosure is directed to devices with matrix-addressed arrays of elements on a substrate and is described with respect to displays. However, in certain embodiments, the present invention can be (e.g., additionally) directed to any matrix-addressed device, for example including a sensor array. Such sensor arrays can be used in imaging, for example medical imaging to form images. Thus, according to some embodiments of the present invention, a single metal layer sensor array comprises a sensor substrate having a sensor surface with a sensor area and a patterned metal layer disposed in or on the sensor substrate in the sensor area. The patterned metal layer is at least partially exposed on the sensor surface. The patterned metal layer forms a two-dimensional array of spatially separated column line segments in the sensor area, each column line segment extending only partially across the sensor area in a column direction. The patterned metal layer also forms a one-dimensional array of row lines extending across the sensor area in a row direction different from the column direction. The row lines and column line segments are electrically separate in the patterned metal layer and in the sensor substrate. A plurality of spatially separated electrical jumpers can be disposed in the sensor area on the sensor surface with each electrical jumper electrically connected to two column line segments adjacent in the column direction to electrically connect the adjacent column line segments and form a one-dimensional array of electrically continuous column lines extending across the sensor area in the column direction, wherein each electrical jumper has an independent jumper substrate independent of and separate from the sensor substrate and independent of and separate from the jumper substrate of any other electrical jumper. A plurality of spatially separated light-sensitive pixel circuits can be disposed in the sensor area on the sensor surface, each pixel circuit electrically connected to at least one row line of the array of row lines and one column line of the array of electrically continuous column lines.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which:

FIG. 2A is a schematic plan view of a pixel circuit according to an illustrative embodiment of the present invention;

FIG. 2B is a schematic cross section of FIG. 2A along cross section line C;

FIG. 3A is a schematic plan view of a pixel circuit including a control circuit according to an illustrative embodiment of the present invention;

FIG. 3B is a schematic cross section of FIG. 3A along cross section line D;

FIG. 7A is a schematic bottom plan view of a pixel circuit and electrical jumper in a common device with a common pixel substrate and a plurality of row lines for controlling red, green, and blue light emitters according to an illustrative embodiment of the present invention;

FIG. 7B is a schematic cross section of the pixel substrate of FIG. 7A along column line 17;

FIGS. 8A-8E are schematic bottom plan views of various redundant connections and pixel circuits according to various illustrative embodiments of the present invention;

FIGS. 11A-11F are schematic cross sections of sequential steps useful in making an electrical jumper with connection posts in a jumper source wafer according to an illustrative embodiment of the present invention;

FIG. 13 is a schematic cross section of a stamp, electrical jumper, and display substrate illustrating micro-transfer printing the electrical jumper onto the display substrate according to an illustrative method of the present invention;

FIG. 14 is a schematic cross section of an electrical jumper micro-transfer printed onto the display substrate with connection posts according to an illustrative embodiment of the present invention;

Figure 1A:
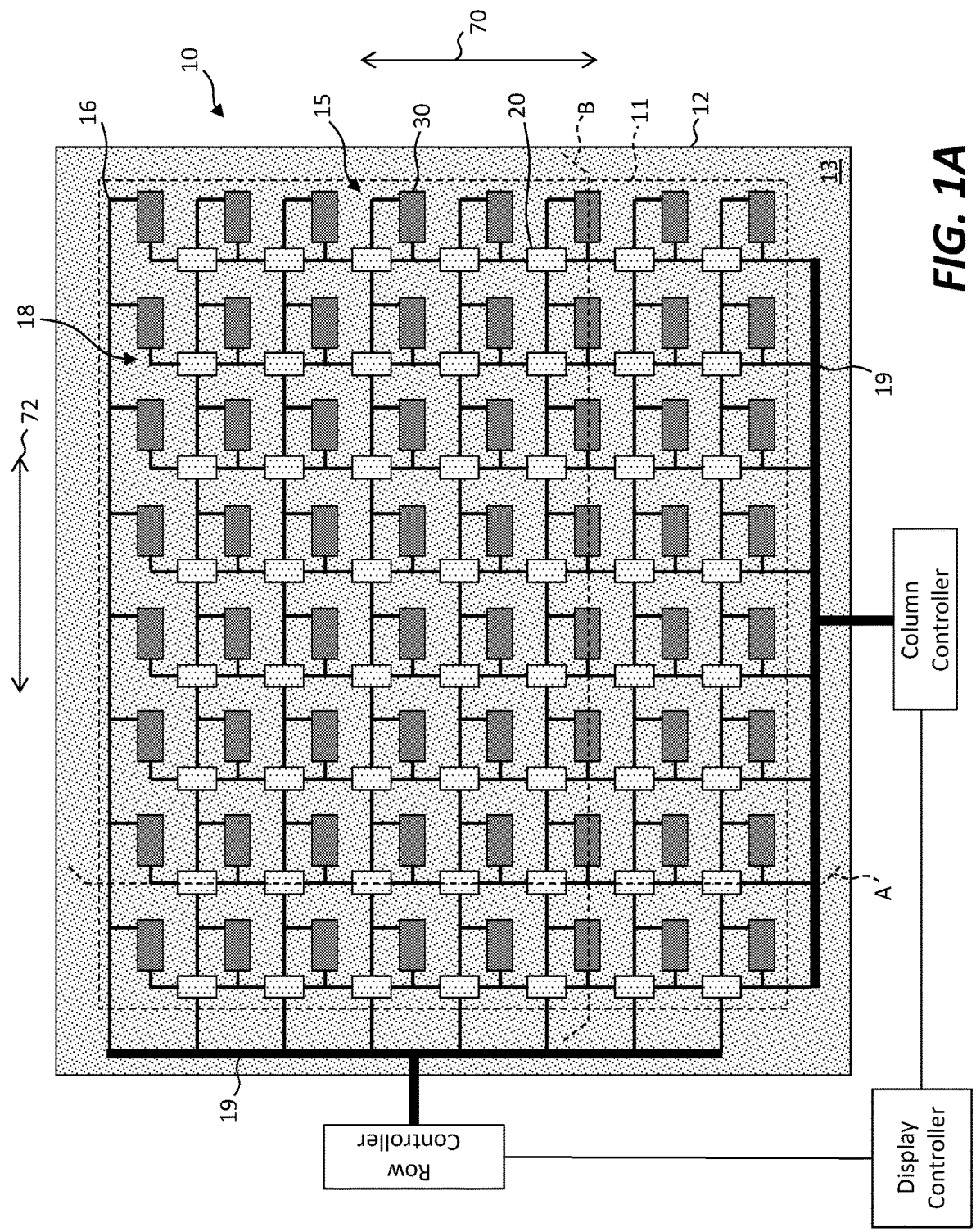
FIG. 1A is a schematic plan view of an illustrative embodiment of the present invention.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not drawn to scale since the variation in size of various elements in the Figures is too great to permit depiction to scale.

DETAILED DESCRIPTION OF THE INVENTION

Figure 1B:
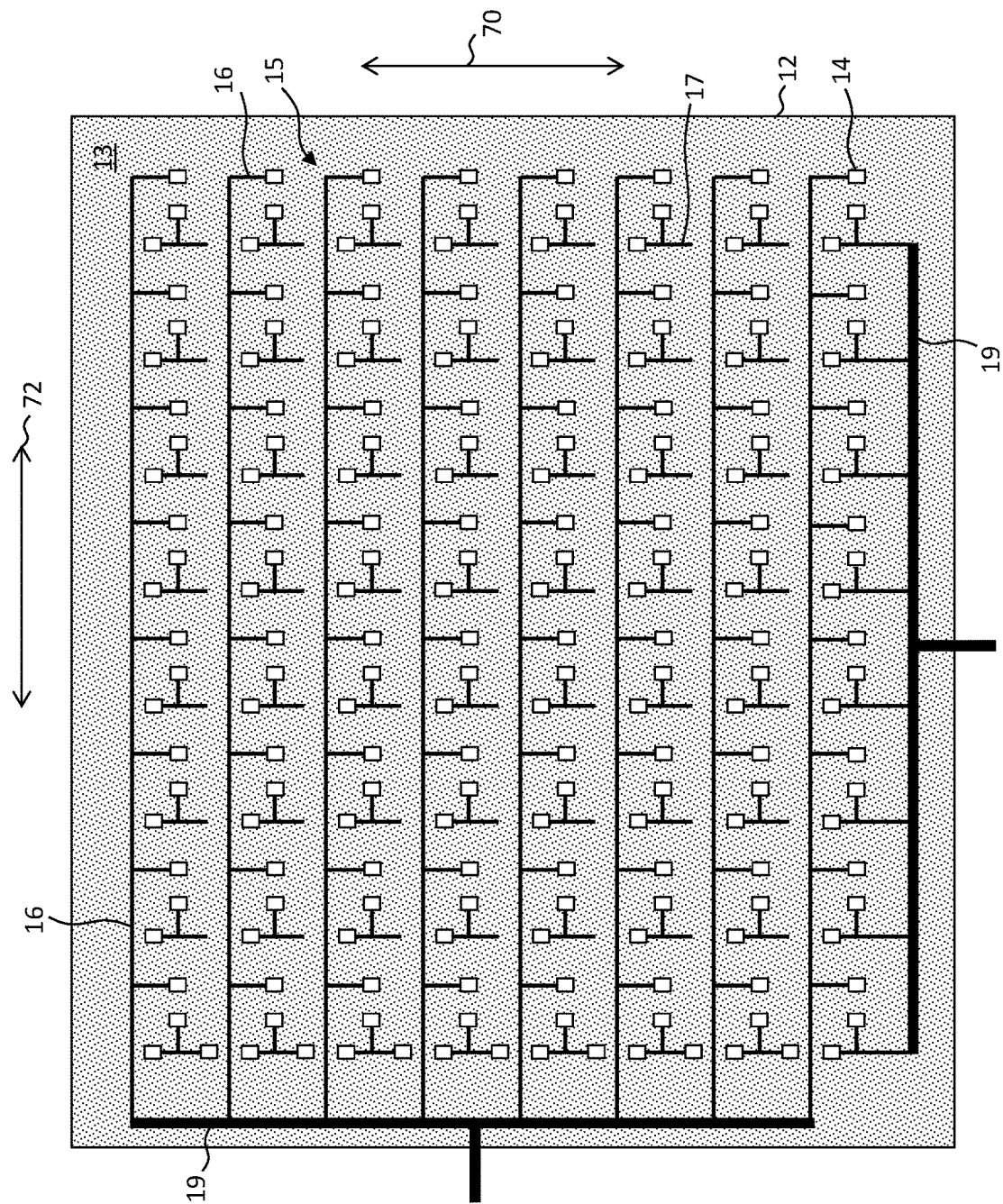
FIG. 1B is a schematic plan view of the illustrative embodiment of FIG. 1A with electrical jumpers and pixel circuits removed to expose the patterned metal layer and contact pads.
Figure 1C:
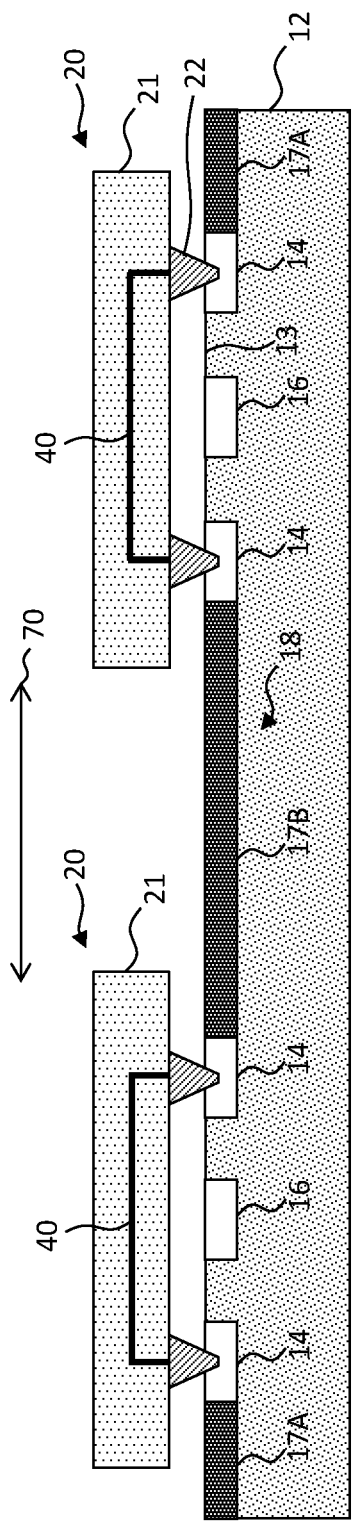
FIG. 1C is a partial schematic cross section of FIG. 1A along cross section line A.
Figure 1D:
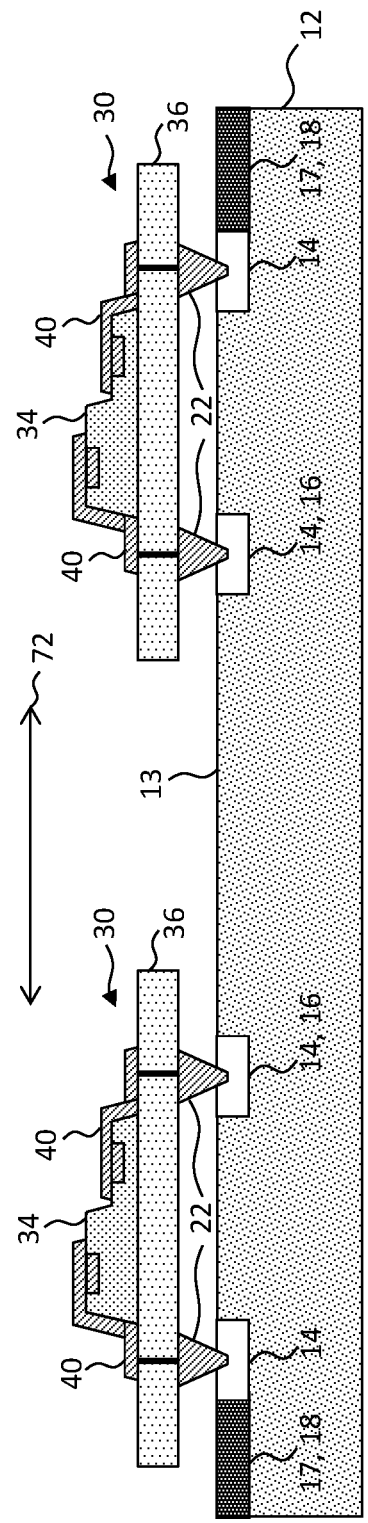
FIG. 1D is a partial schematic cross section of FIG. 1A along cross section line B.

In certain embodiments, the present disclosure is directed to a single metal layer display 10, for example as illustrated in FIG. 1A in schematic plan view, FIG. 1B in partial schematic plan view, FIG. 1C in partial cross section taken along cross section line A, and FIG. 1D in partial cross section taken along cross section line B. A single metal layer display 10 is a display for presenting information that is constructed on or over a display substrate 12 having a display surface 13 with a display area 11. In certain embodiments, the display surface 13 is suitable for photolithographic or printed circuit board materials and processes or for micro-transfer printing. A patterned single layer of metal 15 is disposed in or on the display substrate 12 in the display area 11 and is at least partially exposed on the display surface 13. Some or all of the metal in a patterned single layer of metal 15 can be exposed. The display substrate 12 can have additional metal layers or other dielectric layers, electrical connections between layers, vias, or other photolithographically defined or printed circuit board layers. However, according to some embodiments of the present invention, the single patterned metal layer 15 provides at least all of the electrical wiring, electrical interconnections, and electrical contacts necessary to provide control signals to an array of pixel circuits 30 disposed over or on the display substrate 12. The single patterned metal layer 15 can also provide power and ground signals. The single metal layer 15 can be entirely exposed for electrical connection on the display surface 13 of the display substrate 12. In some embodiments, an insulating layer is provided over the single metal layer 15 with vias provided through the insulating layer to enable electrical connections to the single metal layer 15.

The single metal layer 15 can be formed over the display substrate 12 using photolithographic processes used in the display industry, for example including blanket metal deposition methods such as evaporation, spin or curtain coating photo-patternable photoresist over the metal layer 15, exposing the photoresist to a pattern of radiation through a mask, and curing, etching and removing the photoresist to form the patterned metal layer 15. Alternatively, printed circuit board techniques or lamination methods can be employed. The single metal layer 15 can include electrically conductive metals such as aluminum, copper, silver, gold, tin, titanium, or tungsten or metal alloys. The metal layer 15 can include metal oxides, including indium tin oxide, aluminum zinc oxide, or other transparent metal oxides, or conductive inks containing electrically conductive particles such as metal or metal coated particles of any suitable size. In particular, in certain embodiments, the single metal layer 15 comprises any patterned electrical conductor, including conductive organic materials that are not metal such as electrically conductive polymers such as, for example, polythiophene. The phrase "single metal layer" is used for convenience, simplicity, and clarity because most conventional substrate conductors are metal and the phrase "metal layer" is widely used in the photolithographic, integrated circuit, and display industries. However, according to embodiments of the present invention, the phrase "single metal layer" can be replaced throughout this specification with the phrase "single electrically conductive layer" and "metal" in this context can be replaced with "electrical conductor."

The patterned metal layer 15 forms a two-dimensional array of spatially separated column line segments 17 in the display area 11. Each column line segment 17 extends only partially across the display area 11 in a column direction 70. The patterned metal layer 15 also forms a one-dimensional array of row lines 16 extending across the display area 11 in a row direction 72 different from the column direction 70. In some embodiments, row lines 16 extend across and also beyond a display area 11. In some embodiments, the row direction 72 and the column direction 70 are orthogonal. The row lines 16 and column line segments 17 are electrically separate in the patterned metal layer 15 and in the display substrate 12 in the display area 11. Electrically separate in the patterned metal layer 15 and in the display area 11 of the display substrate 12 means that the patterned metal layer 15 or other conductive elements in the display substrate 12 do not provide electrical connections between separate column line segments 17 and do not provide electrical connections between column line segments 17 and row lines 16. A line, as intended herein, is a passive electrically conductive element such as a wire, conductor, or trace patterned over the display substrate 12 to conduct electrical signals such as power, ground, or control signals in the display area 11.

Because the row lines 16 extend substantially across the display area 11 but are not electrically connected to the column line segments 17 in the patterned single metal layer 15, each row line 16 passes between two column line segments 17 that are adjacent in the column direction 70 for each column of column line segments 17 in the two-dimensional array of column line segments 17. The column line segments 17 are electrically connected in electrically continuous column lines 18 through a plurality of spatially separated electrical jumpers 20 that are not in the display substrate 12 but are disposed in the display area 11 on or over the display surface 13. Each electrical jumper 20 electrically connects two column line segments 17 that are adjacent in the column direction 70, for example with wires 40 in the electrical jumper 20, to electrically connect the adjacent column line segments 17 and form a one-dimensional array of separate, electrically continuous column lines 18 extending substantially across the display area 11 in the column direction 70. Wires 40 can be any patterned electrical conductor and can be made, for example, of metal, metal oxide, or conductive inks. Each electrical jumper 20 has an independent jumper substrate 21 independent of and separate from the display substrate 12 and independent of and separate from the jumper substrate 21 of any other electrical jumper 20. In particular, the electrical jumpers 20 are not formed on or in the display substrate 12 with photolithographic or printed circuit board techniques used to make multi-layer display substrate or printed circuit board electrical conductors.

A plurality of spatially separated light-emitting pixel circuits 30 is disposed in the display area 11 on or over the display surface 13 of the display substrate 12. Each pixel circuit 30 is electrically connected to at least one row line 16 and one column line segment 17 of a column line 18. The pixel circuits 30 can be formed in or on the display substrate 12 (e.g., as a thin-film circuit) or, in some embodiments, can be formed on a separate pixel substrate 36 and disposed and electrically connected to the row lines 16 and column lines 18. The pixel circuits 30 can form pixels in the single metal layer display 10. The pixels can be operated by a display controller that controls row and column controllers connected to the row lines 16 and column lines 18, respectively, by electrical buses 19. Display, row, and column controllers can be integrated circuits mounted on the display substrate 12 or connected externally to the display substrate 12, for example by flexible ribbon cables (not shown).

FIG. 1B illustrates the single metal layer display 10 of FIG. 1A without the electrical jumpers 20 or pixel circuits 30 so that the contact pads 14 and the electrical connections between the row lines 16, the column line segments 17, the electrical jumpers 20, and the pixel circuits 30 are more clearly visible. The vertical extensions extending to the locations of the pixel circuits 30 from the horizontal row lines 16 are considered to be a part of the row lines 16. Likewise, the horizontal extensions extending to the locations of the pixel circuits 30 from the vertical column line segments 17 are considered to be a part of the column lines 18. Notwithstanding these local extensions, the row lines 16 substantially extend across the display area 11 in the row direction 72 and the column lines 18 substantially extend across the display area 11 in the column direction 70. To extend across the display area 11 means to extend to all of the pixel circuits 30 or electrical jumpers 20 in the display area 11 (e.g., not extending beyond the display area 11 indicated). The line layout of FIGS. 1A and 1B are illustrative and selected for presentation clarity; knowledgeable circuit designers will recognize that alternative electrically equivalent layouts are possible and readily designed. For example, in an alternative layout, either of the horizontal or vertical extensions is omitted and the location of the pixel circuit 30 moved to overlap with the column line segment 17 or row line 16, respectively.

The display substrate 12 can include optional contact pads 14 for making electrical connections to the electrical jumpers 20 and to the pixel circuits 30. The contact pads 14 can be a part of the patterned single metal layer 15 or a part of the row lines 16, column lines 18, or column line segments 17. In some embodiments of the present invention, specially formed contact pads 14 are not necessary but are illustrated to clarify the electrical connections with or the locations of the electrical jumpers 20 and the pixel circuits 30.

Each pixel circuit 30 can include one or more light-emitting elements, for example a light-emitting diode (LED), an organic light-emitting diode, or an inorganic light-emitting diode. In some embodiments, all of the light-emitting elements emit light of the same color or emit a white color. In some embodiments, the pixel circuits 30 are provided in groups. Each group emits a different color of light (for example red, green, or blue) and all of the light-emitters within a group emit the same color. In some embodiments, each pixel circuit 30 includes two or more light emitters that each emit a different color of light. For example, each pixel circuit 30 can include a red light emitter that emits red light, a green light emitter that emits green light, and a blue light emitter that emits blue light. Each pixel circuit 30 can enable a full-color pixel in an array of pixels in the single metal layer display 10.

As is well understood in the art, row and column are arbitrary designations and can be exchanged while maintaining the functionality of a single metal layer display 10.

The pixel circuits 30 can be passive-matrix circuits and a single metal layer display 10 can be a passive-matrix single metal layer display 10. Alternatively, pixel circuits 30 can be active-matrix circuits that each include at least one transistor and a single metal layer display 10 can be an active-matrix single metal layer display 10. In some embodiments, pixel circuits 30 have different connections to the display substrate 12 (e.g., for providing power, ground, and control signals), such as row control signals, column control signals, or data signals for each light emitter in the pixel circuit 30. The number of connections can be different in different embodiments.

In certain embodiments, by requiring only a single patterned metal layer 15 on the display substrate 12, manufacturing costs for the display substrate 12 are reduced.

Referring specifically to FIG. 1C, in some embodiments, each electrical jumper 20 includes at least first and second connection posts 22 protruding from the jumper substrate 21. The first connection post 22 is in electrical contact with a first column line segment 17A and the second connection post 22 is in electrical contact with a second column line segment 17B adjacent to the first column line segment 17A in the column direction. In certain embodiments, each connection post 22 physically contacts a contact pad 14. Each connection post 22 can extend into or pierce the contact pad 14 (or row line 16 or column line segment 17) with which it is in electrical contact. The wires 40 of the electrical jumper 20 can be formed in or on the jumper substrate 21 using photolithographic or integrated circuit methods.

Similarly, referring specifically to FIG. 1D, each pixel circuit 30 can comprise an independent pixel substrate 36 separate and different from the display substrate 12 and independent and separate from the pixel substrate 36 of any other pixel circuit 30. Each pixel circuit 30 can include one or more light emitters that are disposed on the pixel substrate 36, for example light-emitting diodes (LEDs) 34, for example, transferred to the pixel substrate 36 by micro-transfer printing, and electrically connected to the contact pads 14 by wires 40 to form a compound micro-assembled structure with multiple substrates. In some such embodiments, each pixel substrate 36 includes at least row and column connection posts 22. The row connection post 22 is in electrical contact with a row line 16 and the column connection post 22 is in contact with a column line segment 17 that is part of a column line 18.

Although some embodiments of the present invention illustrate the use of connection posts 22 to enable electrical connections with micro-transfer printing, in some other embodiments of the present invention, photolithographic processes are used to pattern metal electrical connections between the display substrate 12 and, for example, pixel circuits 30, light emitters, and electrical jumpers 20.

Referring to the plan view of FIG. 2A and the cross section of FIG. 2B taken across cross section line C of FIG. 2A, in some embodiments of the present invention, the pixel circuit 30 is a passive circuit and the pixel substrate 36 can be a non-semiconductor material such as glass or plastic. In some such embodiments, the pixel circuit 30 includes three light emitters, LEDs 34R, 34G, and 34B (collectively LEDs 34) that when operated emit red, green, and blue light respectively. LEDs 34 can be disposed on the pixel substrate 36 by micro-transfer printing. The pixel circuit 30 can include wires 40 (not shown) in a simple wiring connection to enable operation of the pixel circuit 30 and LEDs 34 by external controllers. The wires 40 can be made using conventional substrate processing methods and can electrically interconnect LEDs 34 to connection posts 22.

In some embodiments, referring to the plan view of FIG. 3A and the cross section of FIG. 3B taken across cross section line D of FIG. 3A, the pixel circuit 30 can be an active circuit and can include, for example, control transistors in a control circuit 38 that controls the LEDs 34. In some such embodiments, the pixel substrate 36 is a semiconductor substrate such as a silicon substrate and the control circuit 38 is native to the semiconductor substrate and uses portions of the semiconductor substrate material as active components in the circuit, for example, as a transistor, made using integrated circuit processing technology. In some embodiments, as shown in FIGS. 3A and 3B, the pixel circuit 30 includes three light emitters, LEDs 34R, 34G, and 34B (collectively LEDs 34) that when operated by the native control circuit 38 emit red, green, and blue light respectively. The LEDs 34 can be disposed on the pixel substrate 36 by micro-transfer printing from an LED source wafer. The pixel circuit 30 includes wires 40 (not shown) as interconnections within the control circuit 38, to electrically connect the control circuit 38 to connection posts 22, and to electrically interconnect the LEDs 34 to the control circuit 38. The wires 40 can be made using conventional substrate processing methods.

Figure 4A:
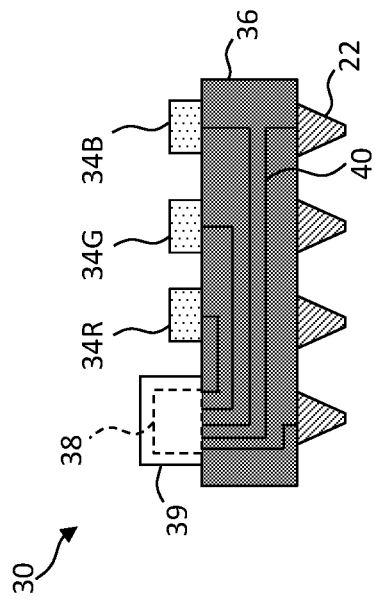
FIG. 4A is a schematic plan view of a pixel circuit including a control circuit in a separate substrate according to an illustrative embodiment of the present invention.
Figure 4B:
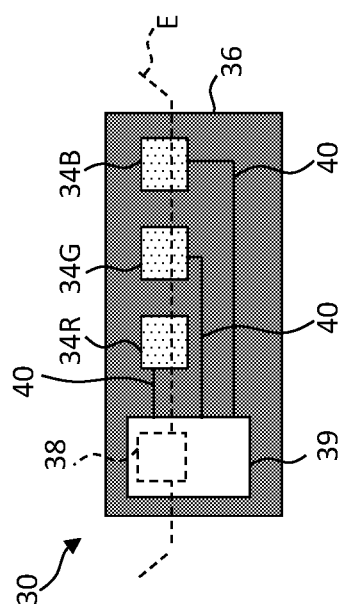
FIG. 4B is a schematic cross section of FIG. 4A along cross section line E.

Referring to the plan view of FIG. 4A and the cross section of FIG. 4B, taken across cross section line E of FIG. 4A, in some embodiments of the present invention, each pixel circuit 30 comprises a semiconductor substrate 39 such as a silicon substrate different from the display substrate 12 that includes a control circuit 38 native to the semiconductor substrate 39. The semiconductor substrate 39 is different from the pixel substrate 36 of any other pixel circuit 30 and different from the semiconductor substrate 39 of any other control circuit 38. The semiconductor substrate 39 is disposed on the pixel substrate 36, for example by micro-transfer printing from a semiconductor source wafer. In the illustrative embodiment of FIGS. 4A and 4B, and also as in the embodiment of FIGS. 2A and 2B, the pixel substrate 36 can be a non-semiconductor substrate, for example glass or plastic that supports only passive electrical elements such as wires 40 to interconnect the LEDs 34 to the control circuit 38 of the semiconductor substrate 39 and to the connection posts 22. In some embodiments, the pixel circuit 30 includes three light emitters, LEDs 34R, 34G, and 34B (collectively LEDs 34) that when operated by the control circuit 38 emit red, green, and blue light respectively. The LEDs 34 and the semiconductor substrate 39 can be disposed on the pixel substrate 36 by micro-transfer printing and then interconnected using integrated circuit and display substrate processing methods.

As is further shown in FIGS. 4A and 4B, in some embodiments, the pixel circuit 30 includes at least first and second wires 40 formed on or in the pixel substrate 36. Each pixel substrate 36 includes at least first and second connection posts 22. The first connection post 22 is in electrical contact with the first wire 40, and the second connection post 22 is in contact with the second wire 40. Moreover, one or more LEDs 34 can each include a light-emitting structure electrically connected to at least the first and second connection posts 22 in the pixel circuit 30 or to the control circuit 38. As shown, the pixel circuits 30 can include more than two connection posts 22 protruding from the pixel substrate 36 and electrically connected with wires 40 to the control circuit 38, for example to provide additional control, power, or ground signals to the control circuit 38 and LEDs 34.

The structure of FIGS. 2A and 2B enable a simple passive-matrix display. The structure of FIGS. 3A and 3B enable an active-matrix display having a pixel circuit 30 with a reduced area provided by disposing the LEDs 34 on the control circuit 38. The structure of FIGS. 4A and 4B enable an active-matrix display having a pixel circuit 30 with an independent control circuit 38 provided by disposing the LEDs 34 and the control circuit 38 on the pixel substrate 36 using micro-transfer printing that is suitable for light emission through the pixel substrate 36 and, in some embodiments, through the display substrate 12.

All of the illustrative embodiments of FIGS. 2A-4B incorporate multiple substrates (e.g., where the LED 34 has an LED substrate). Such micro-assembled structures with multiple substrates form a compound micro-assembled structure.

By micro-transfer printing the LEDs 34 and semiconductor substrate 39, if present, onto the pixel substrate 36, high-performance integrated circuit processes can be used to make the LEDs 34 and semiconductor substrate 39 on source wafers at a relatively lower cost rather than on the display substrate 12 at a relatively higher cost. Furthermore, higher resolution processes are used and structures made that have a higher performance than similar processes and structures on a display substrate 12. In addition, use of connection posts 22 enables the electrical interconnection of relatively high-resolution features (e.g., in pixel circuits 30) to relatively-low-resolution features (e.g. row and column lines 16, 18) of the display substrate 12 in a simple, efficient, and low-cost way.

In various embodiments of the present invention, various numbers of row and column lines 16, 18 can be formed on the display substrate 12 and used to control the light emitters of the pixel circuits 30. Moreover, in certain embodiments, a pixel substrate 36 and a jumper substrate 21 are the same substrate. In these embodiments, the pixel substrate 36 includes wires 40 that provide an electrical jumper 20 and the pixel substrate 36 supports LEDs 34 and any control circuit 38 used to control the LEDs 34 in the pixel circuit 30.

Figure 5:
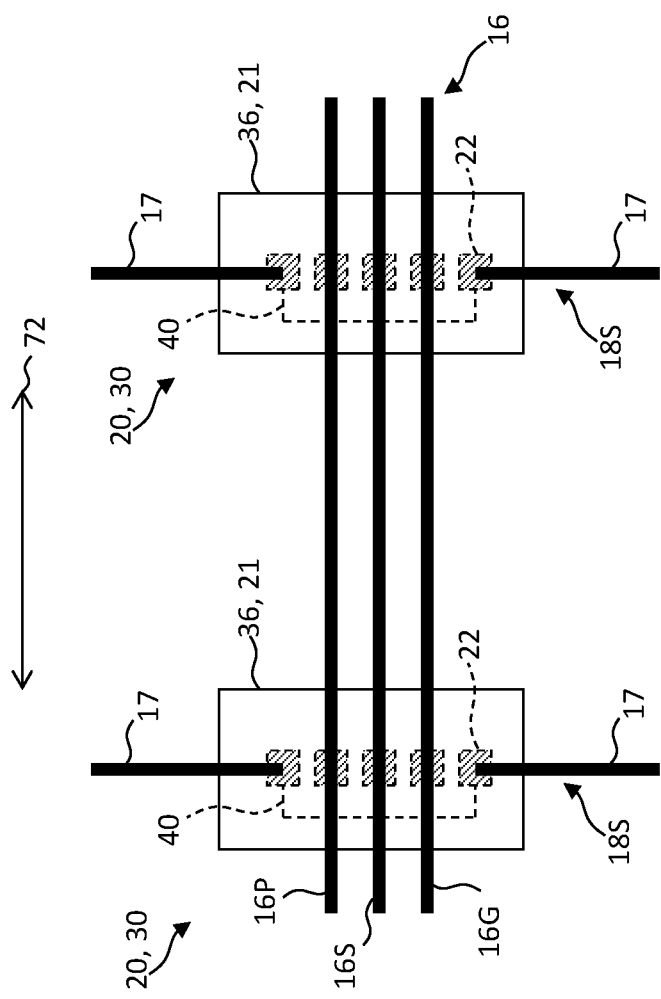
FIG. 5 is a schematic bottom plan view of a pixel circuit and electrical jumper in a common device with a common pixel substrate and a plurality of row lines according to an illustrative embodiment of the present invention.

In some embodiment of the present invention, the pixel circuit 30 can be a passive circuit that simply includes the pixel substrate 36 with wires 40, a plurality of connection posts 22, and an LED 34 (illustrated in FIGS. 2A and 2B without the wires 40). In some active-matrix embodiment of the present invention, as shown in FIG. 5, the patterned metal layer 15 (as shown in the exemplary embodiment in FIG. 1A) forms a plurality of one-dimensional arrays of row lines 16 extending across the display area 11 (as shown in the exemplary embodiment in FIG. 1A) in the row direction 72 that provide multiple signals to the control circuit 38 (not shown). In the illustrative embodiment shown in FIG. 5, one of the arrays of row lines 16P provides a power signal, another one of the arrays of row lines 16S provides a control signal, and yet another one of the arrays of row lines 16G provides a ground signal.

In the illustrative embodiment of FIG. 5, the pixel circuit 30 is connected to one row line 16 of each of the one-dimensional arrays of row lines 16. Wires 40 electrically connect to the connection posts 22 and the LED 34 (not shown in FIG. 5 but as illustrated in FIGS. 3A, 3B, 4A, and 4B). In the illustrative embodiment of FIG. 5, the pixel substrate 36 is also the jumper substrate 21 so that the pixel circuit 30 and the electrical jumper 20 are formed on a common substrate and in a common device. For clarity, the common substrate will be referred to hereafter as the pixel substrate 36 but will be indicated in the Figures as a common substrate that is both a pixel substrate 36 and a jumper substrate 21. The electrical jumper 20 is formed by electrically connecting the farthest apart two connection posts 22 in the column direction 70 with a wire 40, shown as a dashed line in the Figure. In some embodiments, and as shown in FIG. 5, the remaining, central connection posts 22 are electrically connected to the control circuit 38 (not shown in FIG. 5) and the row lines 16P, 16S, and 16G.

Three row lines 16 are included in the example of FIG. 5, a row power line 16P, a row ground line 16G, and a row signal line 16S. The column line segments 17 together with the electrical jumper 20 connections (wire 40 and connection posts 22 on the pixel substrate 36) form the column signal line 18S. In general, the row signal line 16S can act as a select line and the column signal line 18S as a data line (or vice versa) as is commonly done in matrix-addressed analog display control systems. Together, the row power line 16P, the row ground line 16G, the row signal line 16S, and the column signal line 18S operate the LED 34 as an active-matrix pixel under the control of the row, column, and display controllers (as shown in the illustrative embodiment of FIG. 1A). Thus, in some embodiments of a single metal layer display 10, the row lines 16 of one of the arrays of row lines 16 are signal lines, the row lines 16 of one of the arrays of row lines 16 are row power lines, the row lines 16 of one of the arrays of row lines 16 are row ground lines, and the row lines 16 of one of the arrays of row lines 16 are row signal lines. In some embodiments, the row lines 16 of another, different one of the arrays of row lines 16 are also signal lines, or any combination thereof. In general, as many row lines 16 can be disposed between the column line segments 17 as is desired, so long as the pixel substrate 36 (or jumper substrate 21 if the jumper substrate 21 is separate from the pixel substrate 36, as in the illustrative embodiment shown in FIGS. 1A and 1B) is sufficiently large to bridge the distance between the adjacent column line segments 17 in a column.

Figure 6:
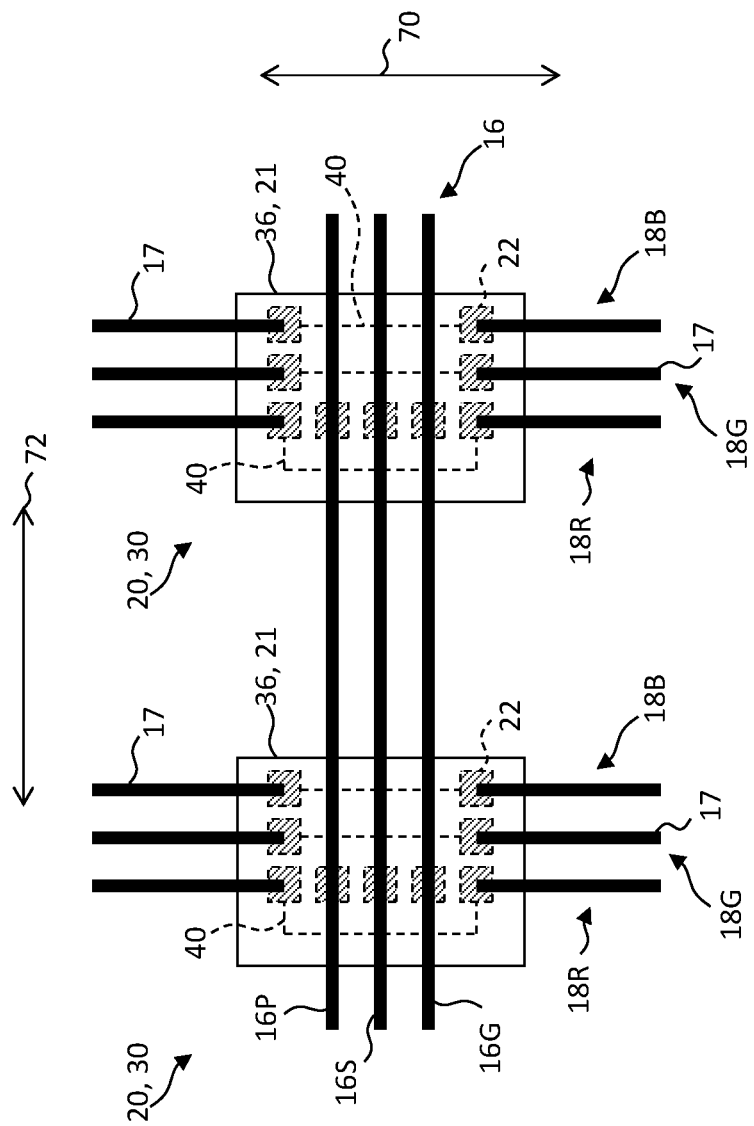
FIG. 6 is a schematic bottom plan view of a pixel circuit and electrical jumper in a common device with a common pixel substrate and a plurality of row lines and column lines according to an illustrative embodiment of the present invention.

FIG. 5 illustrates an illustrative embodiment of the present invention wherein a plurality of row lines 16 pass between the column line segments 17 of a single column line 18 in each pixel to control a single LED 34 with an active-matrix control circuit 38 (as in the illustrative embodiments shown in FIGS. 3A, 3B, 4A, 4B). As shown in the illustrative embodiment of full-color pixels shown in FIG. 6, multiple column lines 18 can also be provided for each pixel circuit 30 with one or several row lines 16. (FIG. 6 illustrates multiple row lines 16 but, in alternative embodiments, only a single row line 16 is provided.) Thus, the patterned metal layer 15 (as shown in the illustrative embodiments shown in FIG. 1A, 1B) forms a plurality of two-dimensional arrays of spatially separated column line segments 17 that extend only partially across the display area in the column direction 70, an electrical jumper 20 electrically connects each pair of column line segments 17 adjacent in the column direction 70 to electrically connect the adjacent column line segments 17 and form a plurality of one-dimensional arrays of electrically continuous column lines 18 extending across the display area 11 in the column direction 70, and the pixel circuit 30 connects to one column line 18 of each of the one-dimensional arrays of column lines 18.

In the illustrative embodiment of FIG. 6, the multiple row lines 16P, 16G, and 16S provide the power, ground, and row select signals as described with respect to FIG. 5. In the illustrative embodiment of FIG. 6, as in that of FIG. 5, the pixel substrate 36 is also the jumper substrate 21 so that the pixel circuit 30 and the electrical jumper 20 are formed on a common substrate in a common device. Multiple electrical jumpers 20 are formed by electrically connecting the furthest apart pairs of connection posts 22 in the column direction 70 with a wire 40.

Three column lines 18R, 18G, and 18B are included in the example of FIG. 6, together with the row power line 16P, the row ground line 16G, and the row signal line 16S. In general, the row signal line 16S can act as a select line and the column signal lines 18R, 18G, and 18B as data lines for each of the red, green, and blue LEDs 34R, 34G, 34B, respectively, as is commonly done in matrix-addressed analog display control systems. Together, the row power line 16P, the row ground line 16G, the row signal line 16S, and the column signal lines 18R, 18G, and 18B operate the LEDs 34R, 34G, 34B, respectively, as a full-color active-matrix pixel under the control of the row, column, and display controllers and control circuit 38. The row, column, and display controllers are shown in FIG. 1A and the LEDs 34R, 34G, 34B and the control circuit 38 are shown in FIGS. 3A, 3B, 4A, 4B.

Thus, in some embodiments of the single metal layer display 10, the column lines 18 of one of the arrays of column lines 18 are signal lines. Alternatively, one or more of the column lines 18 of one of the arrays of column lines 18 are column power lines or column ground lines, or both, or include column signal lines, power lines, or ground lines in any combination. In general, as many arrays or groups of column lines 18 can be disposed in the display area 11 as is desired, so long as the pixel substrate 36 (or jumper substrate 21 if the jumper substrate 21 is separate from the pixel substrate 36 as in FIGS. 1A and 1B) is sufficiently large to connect to all of the adjacent column line segments 17 in each of the columns of each pixel. In some embodiments, the connection posts 22 are disposed around the periphery of the pixel substrate 36.

Referring next to FIGS. 7A and 7B, in some embodiments, the row lines 16 include data signals communicated on row lines 16R, 16S, 16B for each of the LEDs 34R, 34G, 34B, respectively (shown in FIGS. 3A, 3B, 4A, 4B) and the column signal line 18S communicates a column select function. FIG. 7B shows a cross section of FIG. 7A illustrating the protruding connection posts 22, the LEDs 34R, 34G, 34B, and the control circuit 38 (corresponding to the illustrative embodiment shown in FIGS. 3A and 3B).

In some embodiments of the present invention, it can be useful to provide redundant electrical connections to improve the manufacturing yield of the single metal layer display 10. As shown in FIG. 8A, in some embodiments, two connection posts 22 are provided for each electrical connection to the display substrate 12 (shown in FIGS. 1A-1D). Moreover, two wires 40 forming two electrical connection are provided to electrically connect each electrical jumper 20. FIG. 8A illustrates an illustrative embodiment with three row lines 16 and two column lines 18.

As shown in FIG. 8B for a single column line 18, redundancy can be provided by forming a column line extension 17E electrically connected to each column line segment 17 for each pixel that extends in the row direction 72. A redundant connection post 22 is electrically connected to the column line extension 17E. Thus, certain embodiments of the present invention include a column line extension 17E electrically connected to the column line 18 and extending in the row direction 72 providing space on the display substrate 12 (FIG. 1A) for one or more redundant connection posts 22 each electrically connected to the column line 18 or column line 18.

Figure 8C:
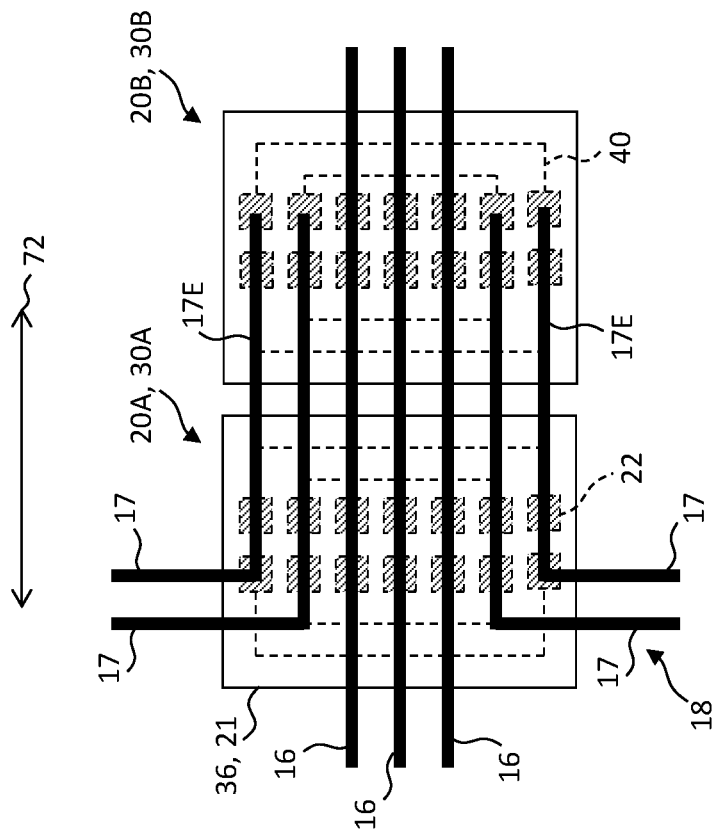

The column line extension 17E structure can be applied to some embodiments with redundant pixel circuits 30A, 30B and redundant electrical jumpers 20A, 20B in a common redundant device, as shown in FIG. 8C. Alternatively, separate redundant pixel circuits 30 and electrical jumpers 20 are provided (not shown). In the illustrative embodiment shown in FIG. 8C, two redundant devices are provided on corresponding pixel substrates 36 (common with jumper substrates 21) so that, if one of the pixel circuits 30A or 30B or one of the electrical jumpers 20A or 20B fails, is defective, or is improperly electrically connected, the other can provide the needed functionality, thereby improving the single metal layer display 10 yields. The redundant devices can be provided as a repair after testing or provided as a duplicate when the single metal layer display 10 is manufactured.

Figure 8D:
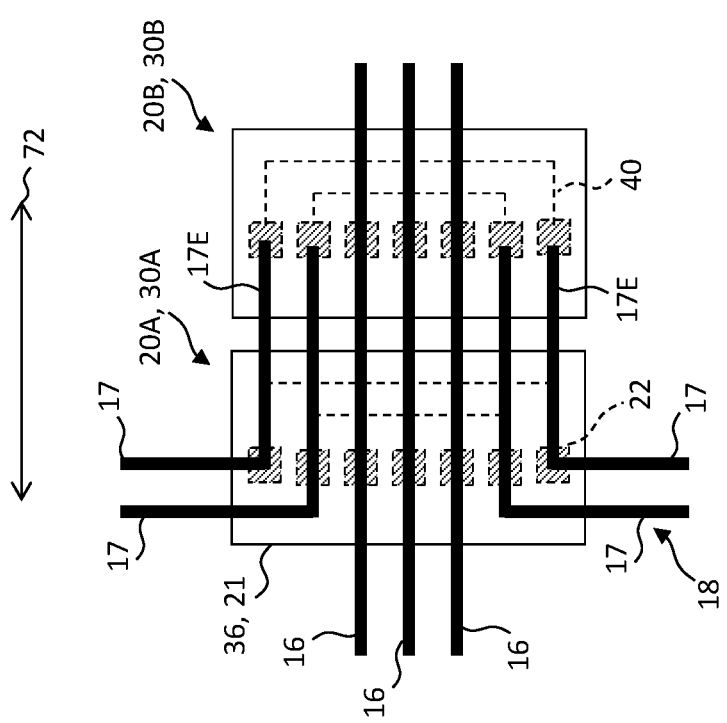

An illustrative embodiment including redundant devices (as in FIG. 8C) and redundant connections (as in FIGS. 8A and 8B) is shown in FIG. 8D. The illustrative embodiment of FIG. 8D includes redundant pixel circuits 30A and 30B and electrical jumpers 20A and 20B. Each connection post 22 of each of the redundant devices is also redundantly connected, providing further improvements in manufacturing yields.

Figure 8E:
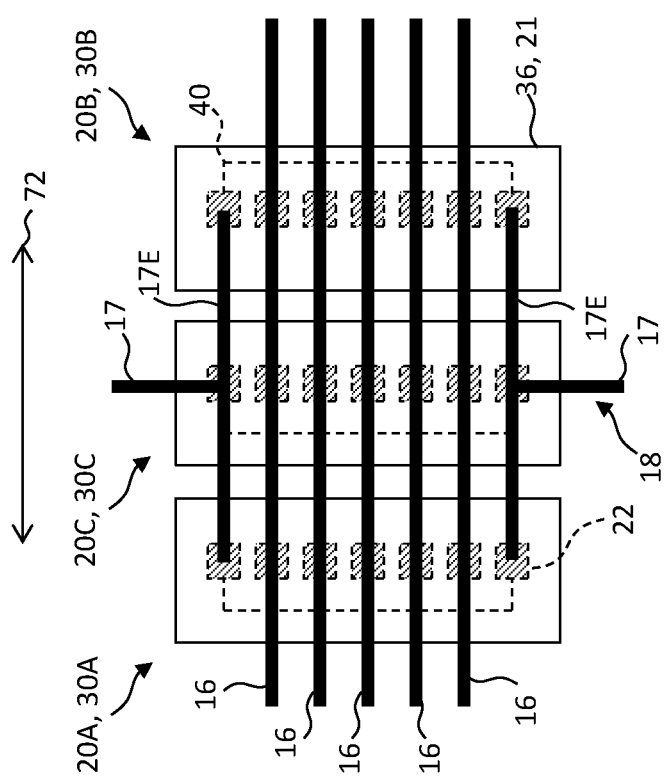

Referring to FIG. 8E, in certain embodiments, the column line extension 17E extends to either side of the column line 18 and column line segment 17, rather than to one side as shown in FIGS. 8B-8D. Locations for three devices in each pixel are shown improving manufacturing yields even further (although the illustrative embodiments of FIGS. 8C and 8D can be extended to three or more redundant devices). The configuration of FIG. 8E corresponds to that of FIGS. 7A and 7B.

In some embodiments of the present invention, a micro-transfer printable circuit (for example as illustrated in FIGS. 5, 6, 7A, 7B, and 8A-8E) comprises a pixel substrate 36 having a pixel circuit 30 with three or more electrical connections (e.g., connection posts 22). At least two of the electrical connections are directly electrically connected to form an electrical jumper 20 and at least two of the electrical connections cause the pixel circuit 30 to emit light when provided with electrical signals. One of the at least two of the electrical connections that cause the pixel circuit 30 to emit light can also be one of the electrical connections that are directly electrically connected to form an electrical jumper 20. In some embodiments, each electrical connection comprises a connection post 22 protruding from the pixel substrate 36.

Figure 9:
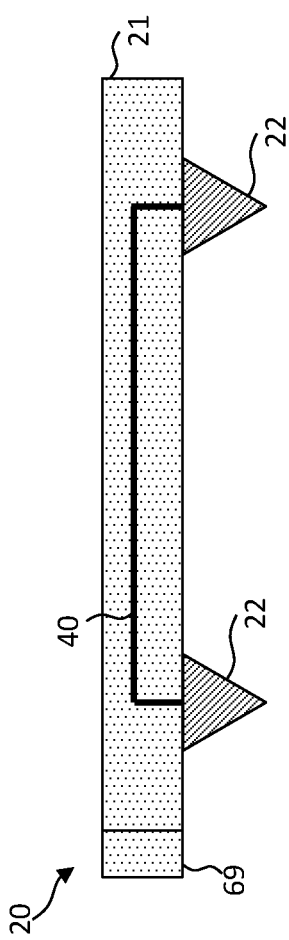
FIG. 9 is a schematic cross section of an electrical jumper with connection posts according to an illustrative embodiment of the present invention.
Figure 10:
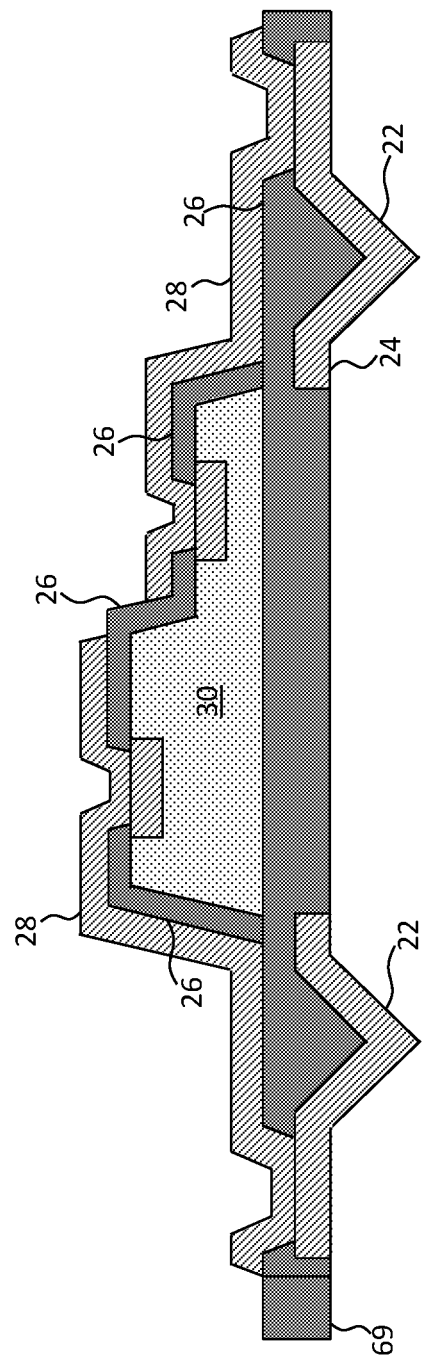
FIG. 10 is a schematic cross section of a light emitting diode with connection posts according to an illustrative embodiment of the present invention.

A schematic illustration of a micro-transfer printed electrical jumper 20 is illustrated in FIG. 9 and includes a jumper substrate 21 with a broken tether 69 and a wire 40 electrically connecting connection posts 22. The jumper substrate 21 can be, for example, a semiconductor (such as silicon), glass, metal, or ceramic wafer. The wires 40 can be any electrical conductor, such as metal. The connection posts 22 can be any protruding structure coated with or made of an electrical conductor, such as metal.

Figure 11F:
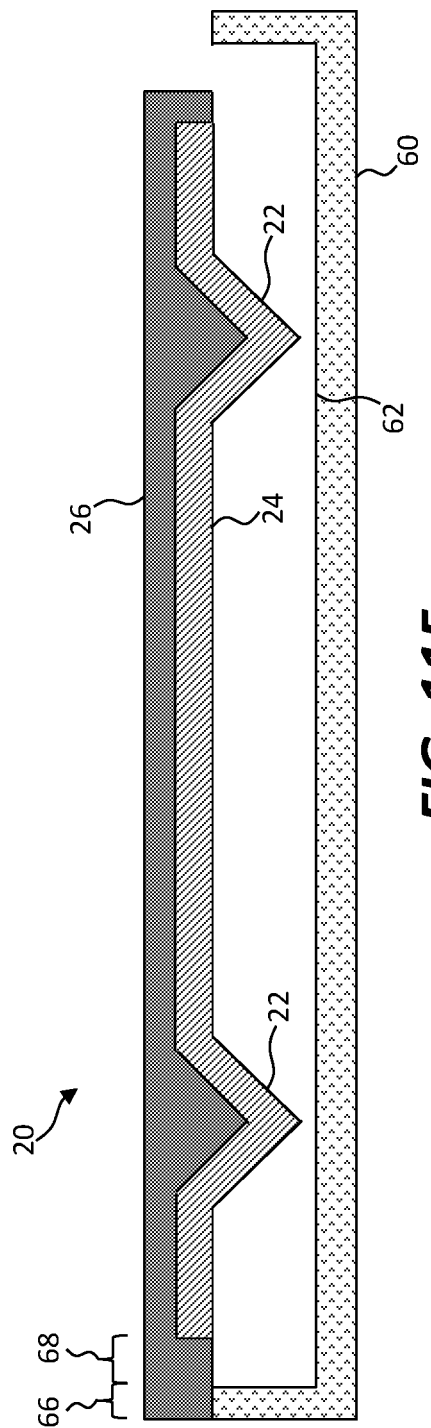

Referring to FIGS. 11A-11F, micro-transfer printable electrical jumpers 20 can be made on a jumper source wafer 60 using photolithographic processes. The jumper source wafer 60 can be, for example, a semiconductor (such as silicon), glass, metal, or ceramic wafer. Suitable wafers for use as jumper source wafers 60 are commercially available and are provided (as shown in FIG. 11A) in certain methods. A sacrificial layer can be patterned on or over the jumper source wafer 60 to form sacrificial portions 62. The sacrificial portions 62 can be designated portions of an anisotropically etchable material (such as silicon) or patterned layers of materials such as oxides, for example silicon dioxide, that are differentially etchable from the jumper source wafer 60 (as shown in FIG. 11B). As shown in FIG. 11C, the sacrificial portions 62 are pattern-wise etched to make forms 64 in the sacrificial portions 62, for example pyramidal depressions, holes, or indentations. Referring next to FIG. 11D, a patterned metal layer 24 (or other patterned conductive layer) is formed over the sacrificial portions 62 and in the forms 64 that electrically connects the portions of the metal in the forms 64. The patterned metal layer 24 forms the wires 40 in the electrical jumper 20 (e.g., see FIG. 1C) and the connection posts 22. A layer of dielectric material 26, for example an oxide or nitride such as silicon dioxide or silicon nitride, is coated over the patterned metal layer 24 to protect it (as shown in FIG. 11E). The sacrificial portion 62 is then etched to undercut the electrical jumper 20 and form tethers 68 physically connecting the electrical jumper 20 to an anchor 66 portion of the jumper source wafer 60 (as shown in FIG. 11F). The electrical jumper 20 can then be micro-transfer printed from the source wafer 60 to the display substrate 12. The deposition, patterning, and etching can be done using photolithographic processes.

Referring to FIG. 13, an electrical jumper 20 can be micro-transfer printed from a jumper source wafer 60 to a display substrate 12 with an elastomeric stamp 50 having pillars 52 corresponding to the location of each micro-transfer printable electrical jumper 20 on the jumper source wafer 60. The electrical jumpers 20 are released from the jumper source wafer 60 by contacting each electrical jumper 20 with a stamp pillar 52 to break the tether 68 making a broken tether 69 (shown in FIG. 9) and adhere the electrical jumper 20 to the pillar 52. The stamp 50 is then transferred to the display substrate 12 and each electrical jumper 20 is pressed against the display substrate 12 in the desired location so that the connection posts 22 are electrically contacted to the contact pads 14 and the electrical jumper 20 is adhered to the display substrate 12 (shown in FIG. 14). The stamp 50 is then removed.

Figure 12A:
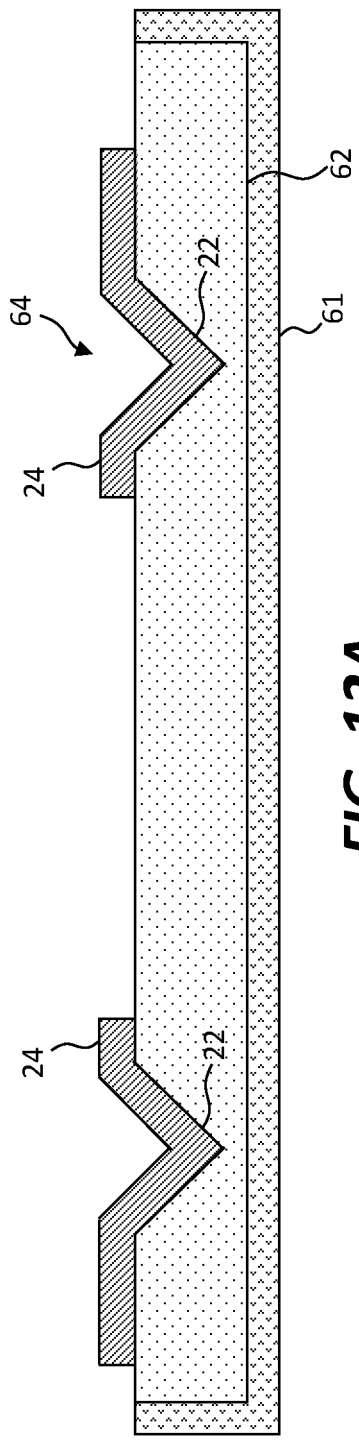
FIGS. 12A-12F are schematic cross sections of sequential steps useful in making an LED with connection posts in an LED source wafer according to an illustrative embodiment of the present invention.
Figure 12B:
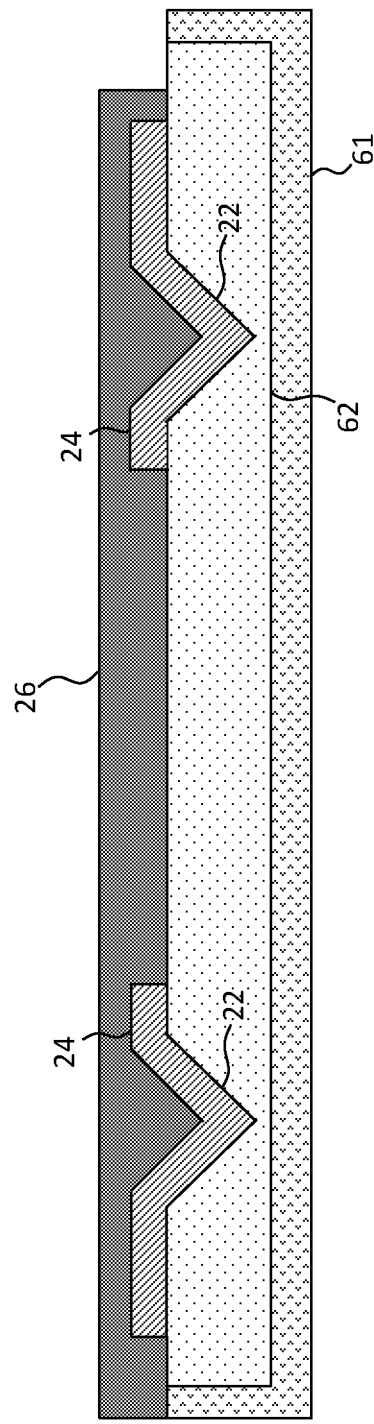
Figure 12C:
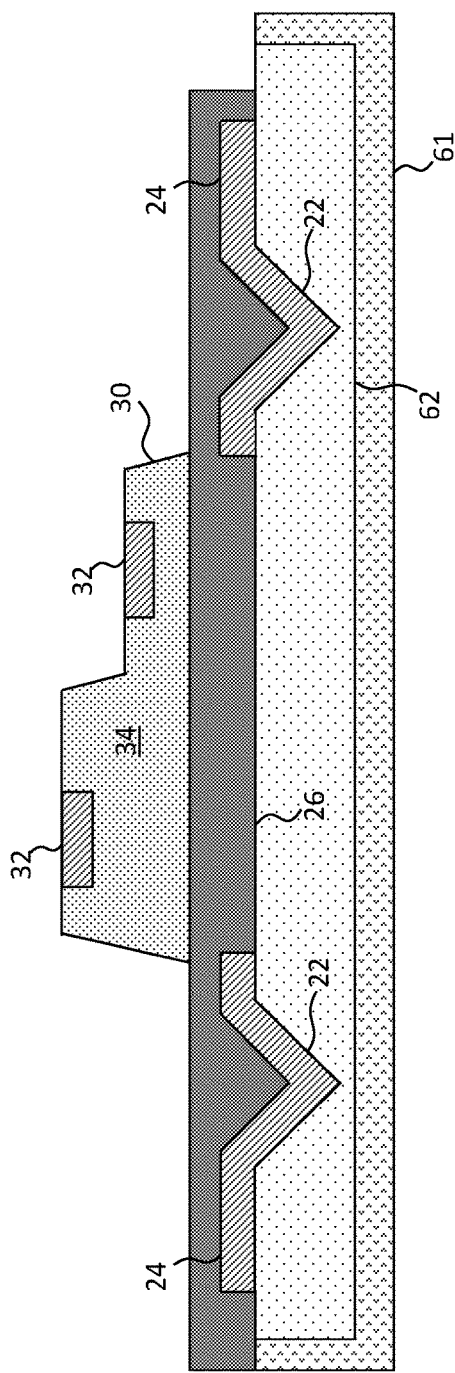

Referring to FIGS. 12A-12F, in some embodiments, micro-transfer printable pixel circuits 30 can be made on a pixel source wafer 61 using photolithographic processes. In some embodiments of the present invention, the pixel source wafer 61 is not a semiconductor, for example, it can be glass, metal, or ceramic wafer, as is the case in the illustrative embodiments of FIGS. 2A, 2B and 4A, 4B. In some embodiments of the present invention, the pixel source wafer 61 is a semiconductor, for example silicon. Suitable pixel source wafers 61 are commercially available. The processing steps shown in FIGS. 11A-11C are carried out on the pixel source wafer 61 (instead of the jumper source wafer 60). However, the patterned metal layer 24 of FIG. 11D is patterned differently as shown in FIG. 12A to provide electrically separate electrical connections from the connection posts 22 to the pixel circuit 30. Referring to FIG. 12B, the layer of dielectric 26 is coated (as in FIG. 11E). Referring to FIG. 12C, LEDs 34 or semiconductor substrates 39 (not shown) are micro-transfer printed to the dielectric layer 26. The LEDs 34 can be horizontal LEDs 34 that emit light through the dielectric layer 26 and include LED contact pads 32 for the electrodes 28.

Figure 12D:
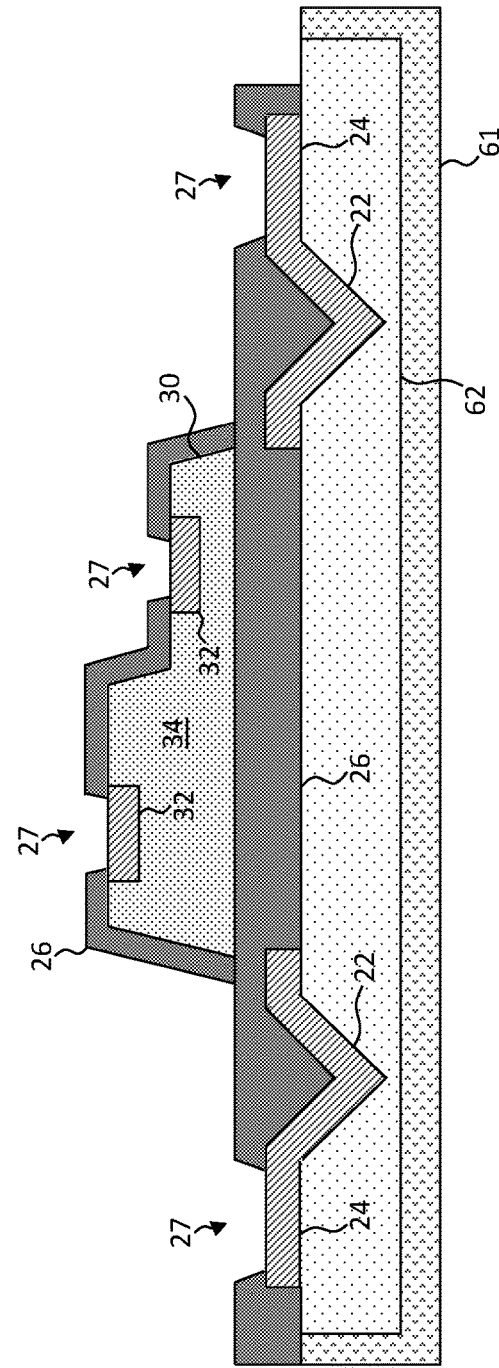
Figure 12E:
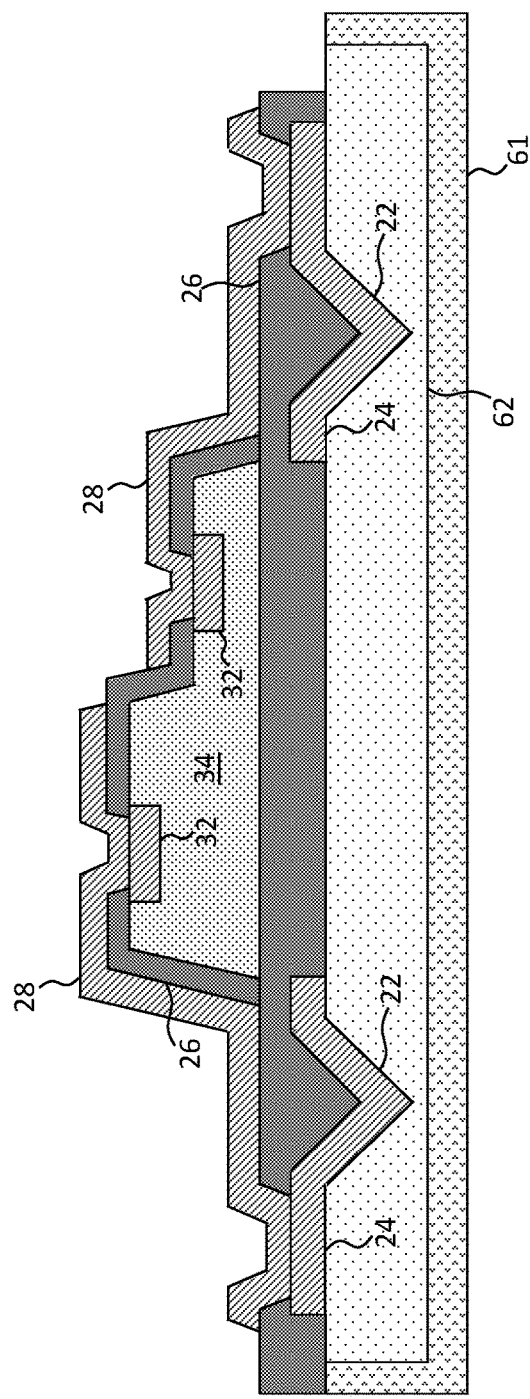
Figure 12F:
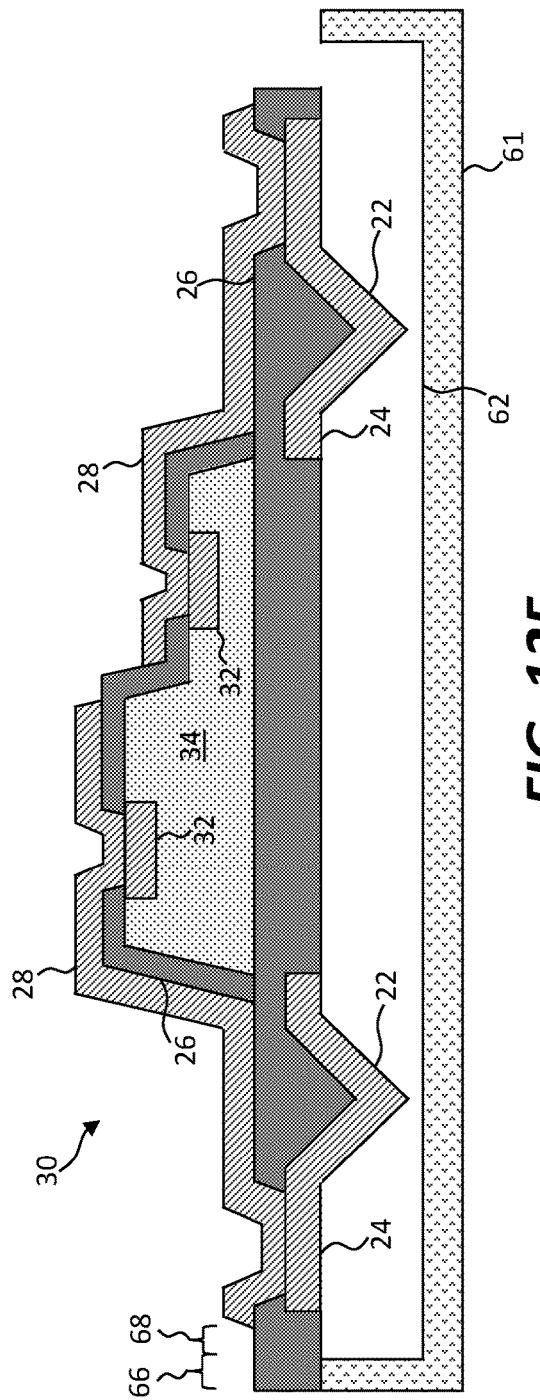

A second dielectric layer 26 is deposited and patterned over the LEDs 34 (and semiconductor substrate 39, if present) with vias 27 opened for each of the LED contact pads 32 and control circuit 38 (if present) electrical connections and the two portions of the patterned metal layer 24 connected to the connection posts 22 (FIG. 12D). Referring to FIG. 12E, a pair of electrodes 28 for controlling the LED 34 and any other needed electrodes 28 are patterned over the dielectric layers 26 connecting through the vias 27 to the connection posts 22 and LED contact pads 32. Next, as shown in FIG. 12F, the sacrificial portions 62 can be etched to make the micro-transfer printable pixel circuits 30, tethers 68, and anchors 66. The pixel circuits 30 can be micro-transfer printed from the pixel source wafer 61 to the display substrate 12 using the same process as described with respect to FIGS. 13 and 14.

FIGS. 12A-12F show stages of an illustrative method for constructing an LED with connection posts. The same illustrative method can be used to provide the semiconductor substrate 39, control circuit 38, or the pixel substrate 36 with connection posts 22. In particular, the same illustrative method can be used to provide connection posts 22 and electrodes 38 that interconnect any control circuit 38, semiconductor substrate 39, LEDs 34, and electrical jumper 20 wires 40 in a common pixel substrate 36 and jumper substrate 21. In some embodiments of the present invention, connection posts 22 protrude from the pixel substrate 36, although the semiconductor substrate 39 or LEDs 34 do not have such protruding connection posts 22. The semiconductor substrate 39 or LEDs 34 are electrically connected using high-resolution, fine electrical connections on the pixel substrate 36 using photolithographic methods after the semiconductor substrate 39 or LEDs 34 are micro-transfer printed onto the pixel substrate 36 (FIGS. 4A, 4B). The pixel substrate 36, with the semiconductor substrate 39 or LEDs 34 can be micro-transfer printed onto the display substrate 12.

Figure 15:
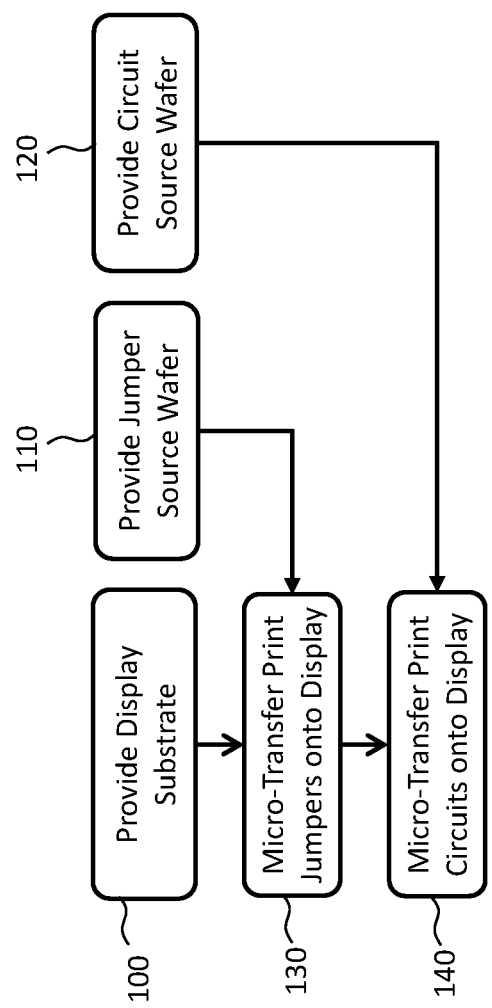
FIG. 15 is a flow diagram illustrating an illustrative method of the present invention.

An illustrative method of the present invention making a single metal layer display 10 is illustrated in the flow diagram of FIG. 15 and includes providing in step 100 a display substrate 12 having a patterned metal layer 15 as described above. A plurality of electrical jumpers 20 are provided on a jumper source wafer 60 in step 110. Each electrical jumper 20 has an independent and separate jumper substrate 21 different from the display substrate 12 and different from the jumper substrate 21 of any other electrical jumper 20. The electrical jumpers 20 are micro-transfer printed onto the display substrate 12 and interconnected in step 130 so that each electrical jumper 20 is electrically connected to two column line segments 17 adjacent in the column direction 70 to electrically connect the adjacent column line segments 17 and form a one-dimensional array of electrically continuous column lines 18 extending across the display area 11 in the column direction 70. A plurality of pixel circuits 30 are provided on a pixel source wafer 61 in step 120. Each pixel circuit 30 has an independent and separate pixel substrate 36 different from the display substrate 12 and different from the pixel substrate 36 of any other pixel circuit 30. The pixel circuits 30 are micro-transfer printed onto the display substrate 12 and interconnected in step 140 so that each pixel circuit 30 is electrically connected to at least one row line 16 and one column line 18. The pixel circuits 30 and the electrical jumpers 20 can have a common substrate. The interconnections of the pixel circuits 30 and the electrical jumpers 20 can be done in the same step or the electrical jumpers 20 can be interconnected after the pixel circuits 30 are micro-transfer printed. In general, step 130 can be done before or after step 140. Electrical interconnection between the electrical jumpers 20 and the display substrate 12 and between the pixel circuits 30 and the display substrate 12 can be done using photolithography or as a consequence of micro-transfer printing the electrical jumpers 20 and the pixel circuits 30 with connection posts 22.

Figure 16:
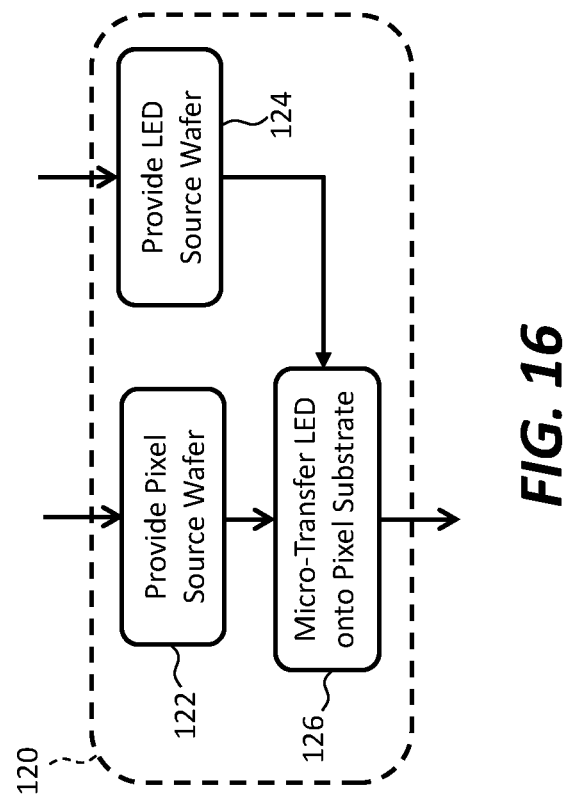
FIG. 16 is a flow diagram illustrating an illustrative method of the present invention.

Referring to FIG. 16, in an illustrative method, a plurality of micro-transfer printable pixel circuits 30 (without LEDs 34) are provided in a pixel source wafer 61 in step 122 and LEDs 34 are provided on one or more, possibly different, LED source wafers in step 124. The LEDS 34 are micro-transfer printed from the LED source wafer(s) to the pixel substrate 36 in step 126 and electrically interconnected to provide a completed micro-transfer printable pixel circuit 30. If the pixel substrate 36 is a semiconductor substrate 39 and has a control circuit 38 formed therein or thereon, a structure corresponding to FIGS. 3A and 3B is formed. If the pixel substrate 36 is not a semiconductor substrate 39 (for example glass or plastic) without a control circuit 38 formed therein or thereon, a structure corresponding to FIGS. 2A and 2B is formed.

Figure 17:
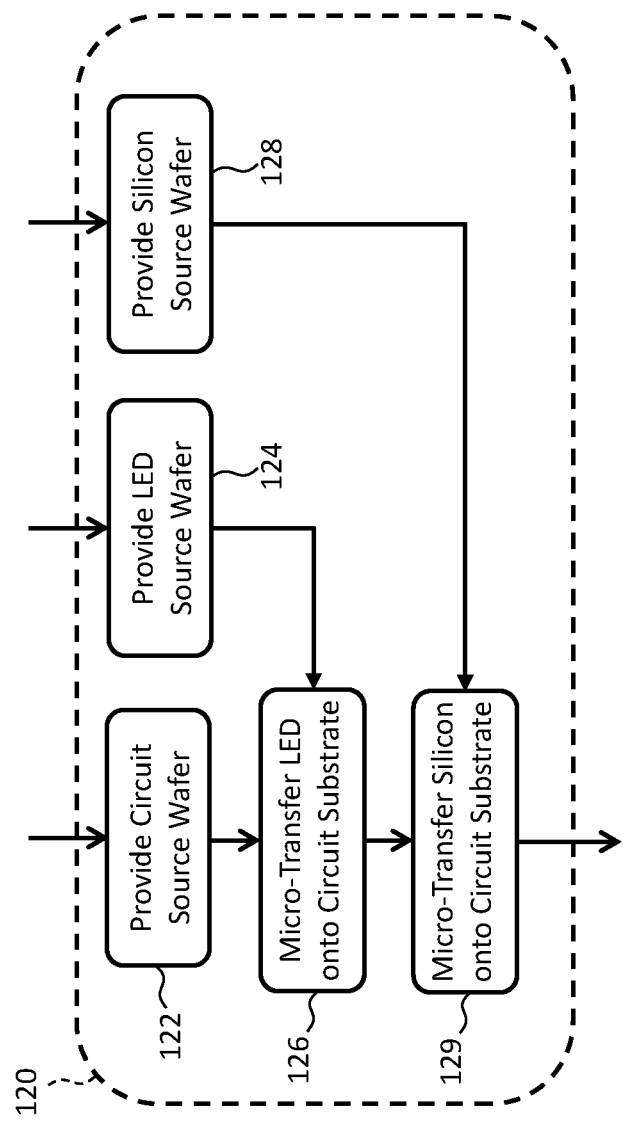
FIG. 17 is a flow diagram illustrating an illustrative method of the present invention.

Referring to FIG. 17, the method of FIG. 16 is extended by providing a silicon source wafer in or on which a plurality of control circuits 38 is or can be formed in step 128. The silicon substrates with the control circuits 38 are micro-transfer printed and electrically interconnected in step 129 onto the pixel substrates 36, for example to form the structure of FIGS. 4A and 4B. The interconnections of the control circuits 38 and the LEDs 34 can be done in the same step or the LEDs 34 interconnected after the silicon substrates are micro-transfer printed. In general, step 126 can be done before or after step 129.

In certain embodiments, the present disclosure is directed to matrix-addressed arrays of elements on a substrate and is described with respect to displays. However, in certain embodiments, the present invention can be (e.g., additionally) directed to any matrix-addressed device, for example including a sensor array. Such sensor arrays can be used in imaging, for example medical imaging to form images. Thus, according to an embodiment of the present invention, a single metal layer sensor array includes a sensor substrate having a sensor surface with a sensor area and a patterned metal layer 15 disposed in or on the sensor substrate in the sensor area. The patterned metal layer 15 is at least partially exposed on the sensor surface. The patterned metal layer 15 forms a two-dimensional array of spatially separated column line segments 17 in the sensor area, each column line segment 17 extending only partially across the sensor area in a column direction 70. The patterned metal layer 15 also forms a one-dimensional array of row lines 16 extending across the sensor area in a row direction 72 different from the column direction 70. The row lines 16 and column line segments 17 are electrically separate in the patterned metal layer 15 and in the sensor substrate. A plurality of spatially separated electrical jumpers 20 can be disposed in the sensor area on the sensor surface with each electrical jumper 20 electrically connected to two column line segments 17 adjacent in the column direction 70 to electrically connect the adjacent column line segments 17 and form a one-dimensional array of electrically continuous column lines 18 extending across the sensor area in the column direction 70, wherein each electrical jumper 20 has an independent jumper substrate 21 independent of and separate from the sensor substrate and independent of and separate from the jumper substrate 21 of any other electrical jumper 20. A plurality of spatially separated light-sensitive pixel circuits can be disposed in the sensor area on the sensor surface, each pixel circuit electrically connected to at least one row line 16 and one column line 18.

In some such sensing embodiments, the patterned metal layer 15, row lines 16, column line segments 17, column lines, 18 electrical jumpers 20, and micro-transfer printing methods and structures are all as described with respect to displays. However, light sensing and light sensing diodes, such as photodiodes made in silicon, replace the light emitters or LEDs. The display substrate, display area, and display surface are a sensor substrate, sensor area, and sensor surface and include essentially the same materials and structures.

In further illustrative methods of the present invention, micro-transfer printing the electrical jumpers 20 electrically interconnects the electrical jumpers 20 with the contact pads 14 on the display substrate 12 so that each electrical jumper 20 is electrically connected to two column line segments 17 adjacent in the column direction 70 to electrically connect the adjacent column line segments 17. Similarly, in certain embodiments, micro-transfer printing the pixel circuits 30 electrically interconnects the pixel circuits 30 with the contact pads 14 on the display substrate 12.

The row lines 16 and column line segments 17 can be opaque, formed of metal, conductive ink, or of electrically conductive transparent metal oxides. The row lines 16 and column line segments 17 can be arranged so that they do not occlude light emitted from the pixel circuits 30. The row lines 16 and column line segments 17 can be made using photolithographic and display substrate processing techniques, for example photolithographic processes employing metal or metal oxide deposition using, for example, evaporation or sputtering, curable resin coatings (e.g., SU8), positive or negative photo-resist coating, radiation (e.g., ultraviolet radiation) exposure through a patterned mask, and etching methods to form patterned metal structures, vias, insulating layers, and electrical interconnections. Inkjet and screen-printing deposition processes and materials can be used to form patterned conductors or other electrical elements.

The display substrate 12 can be any conventional substrate such as glass, plastic, or metal or include such materials. The display substrate 12 can be transparent, for example having a transmissivity greater than or equal to 50%, 80%, 90%, or 95% for visible light. The display substrate 12 usefully has two opposing smooth sides (such as display surface 13) suitable for material deposition, photolithographic processing, or micro-transfer printing of micro-LEDs 34. The display substrate 12 can have a size of a conventional display, for example, a rectangle with a diagonal of a few centimeters to one or more meters and a thickness of 0.1 mm, 0.5 mm, 1 mm, 5 mm, 10 mm, or 20 mm. The light emitters (e.g. micro-LEDs 34 can be provided using photolithographic integrated circuit processes on semiconductor substrates. The micro-LED semiconductor substrates are much smaller than and separate and distinct from the display substrate 12.

In some embodiments, light emitters of the pixel circuit 30 are inorganic micro-LEDs 34. By referring to an LED 34 as a micro-LED 34 is meant that the micro-LED 34 is too small to be directly observed or resolved by a display viewer at the designed viewing distance.

Certain embodiments of the present invention can be constructed using integrated circuit and printed circuit board methods, materials, and processes together with micro-transfer printing methods, structures, and materials. The micro-LEDs 34 can be made using semiconductor materials, integrated circuit materials and processes, and micro transfer materials and printing processes. Electrical conductors patterned on the display substrate 12 such as row lines 16 and column line segments 17 and wires 40 formed in the pixel circuits 30 or electrical jumpers 20 can be made using photolithographic processes with metal or metal oxides, or using technologies including conductive inks, imprinting, printing, electroplating, or inkjet deposition.

In various embodiments of the present invention, the micro-LEDs 34 are formed in a semiconductor substrate using integrated circuit processes. Each micro-LED 34 can have an area or a light-emissive area of, for example, less than 500, 250, 100, or 50 square microns. The micro-LEDs 34 can be spaced apart in one or two dimensions, for example, by 50 microns or more, 100 microns or more, or 500 microns or more, 1000 microns or more, or 2000 microns or more in each dimension over the display area 11. Because micro-LEDs 34 have a relatively small emissive area compared to the display area 11, the emissive fill factor for the single metal display 10 can be very low, for example the area of the micro-LEDs 34 over the display area 11 is less than or equal to one-quarter, one eighth, one tenth, one twentieth, one fiftieth, one hundredth, one five-hundredth, one thousandth, one two-thousandth, or one ten-thousandth of the display area 11 itself.

The electrical jumpers 20 can have a variety of different sizes or emissive areas. For example, the electrical jumpers can have at least one of a width from 2 to 5 μm, 5 to 10 μm, 10 to 20 μm, or 20 to 50 μm, a length from 2 to 5 μm, 5 to 10 μm, 10 to 20 μm, or 20 to 50 μm, and a height from 2 to 5 μm, 4 to 10 μm, 10 to 20 μm, or 20 to 50 μm. Because the electrical jumpers 20 of the present invention can be so small in comparison to prior art jumpers or DIP switches, they can be used in circumstances (such as with pixel arrays in displays) that are not practical for prior-art connection devices that do not rely upon photolithographically made electrical structures.

The micro-LEDs 34 or pixel circuits 30 can likewise have a variety of different sizes or emissive areas. For example, the micro-LEDs 34 or pixel circuits 30 can have at least one of a width from 2 to 5 μm, 5 to 10 μm, 10 to 20 μm, or 20 to 50 μm, a length from 2 to 5 μm, 5 to 10 μm, 10 to 20 μm, or 20 to 50 μm, and a height from 2 to 5 μm, 4 to 10 μm, 10 to 20 μm, or 20 to 50 μm.

In some embodiments of the present invention, the micro-LEDs 34 emit light through the display substrate 12. In other embodiments, the micro-LEDs 34 emit light in a direction opposite (i.e., away from) the display substrate 12.

Electrical interconnections, or wires 40, in the pixel circuits 30 or electrical jumpers 20 can be fine interconnections, for example, having a width of less than 50 microns, less than 20 microns, less than 10 microns, less than five microns, less than two microns, or less than one micron, particularly for micro-LEDs 34 in a pixel circuit 30. Alternatively, row lines 16 and column line segments 17 can include one or more crude lithography interconnections having a width from 2 μm to 2 mm.

Micro-transfer printed electrical jumpers 20 are discussed in U.S. Pat. No. 8,889,485, entitled Methods for Surface Attachment of Flipped Active Components by Christopher Bower, and to U.S. patent application Ser. No. 14/822,864 entitled Chiplets with Connection Posts by Prevatte et al., the disclosures of which are incorporated herein by reference in their entirety.

The single metal layer display 10 can be formed using micro-transfer techniques. In some embodiments, the light emitters (e.g. micro-LEDs 34) or control circuits 38 are micro-transfer printed to the pixel substrate 36 in one or more transfers or the pixel circuits 30 are micro-transfer printed to the display substrate 12. For a discussion of micro-transfer printing techniques see U.S. Pat. Nos. 8,722,458, 7,622,367 and 8,506,867, the disclosure of each of which is hereby incorporated by reference. Additional details useful in understanding and performing aspects of the present invention are described in U.S. patent application Ser. No. 14/743,981, filed Jun. 18, 2015, entitled Micro Assembled LED Displays and Lighting Elements, and U.S. patent application Ser. No. 14/754,573 filed Jun. 29, 2015, entitled Small-Aperture-Ratio Display with Electrical Component, the disclosure of each of which is hereby incorporated by reference in its entirety. A discussion of compound micro-assembly structures and methods is provided in U.S. patent application Ser. No. 14/822,868, filed Aug. 10, 2015, entitled Compound Micro-Assembly Strategies and Devices, the disclosure of which is included by reference herein in its entirety.

As is understood by those skilled in the art, the terms "over", "under", "above", "below", "beneath", and "on" are relative terms and can be interchanged in reference to different orientations of the layers, elements, and substrates included in the present invention. For example, a first layer on a second layer, in some embodiments means a first layer directly on and in contact with a second layer. In other embodiments, a first layer on a second layer can include another layer there between. In other embodiments, a first layer on a second layer means a first layer in the second layer (e.g., "on" can mean "in or on"). For example, a top portion of the second layer is the first layer. Moreover, the terms "row" and "column" can be interchanged since they are defined by the orientation of the display substrate 12.

Having described certain embodiments, it will now become apparent to one of skill in the art that other embodiments incorporating the concepts of the disclosure may be used. Therefore, the invention should not be limited to the described embodiments, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously. The invention has been described in detail with particular reference to certain embodiments thereof, but it will be understood that variations and modifications can be effected within the spirit and scope of the invention.

PARTS LIST

A cross section line A
B cross section line B
C cross section line C
D cross section line D
E cross section line E
10 single metal layer display
11 display area
12 display substrate
13 display surface
14 contact pads
15 patterned metal layer
16 row line
16G ground line
16P power line
16S signal line
16R signal line
16B signal line
17 column line segment
17A first column line segment
17B second column line segment
17E column line extension
18 column line
18S column signal line
18R column signal line
18G column signal line
18B column signal line
19 bus
20 electrical jumper
20A electrical jumper
20B electrical jumper
20C electrical jumper
21 jumper substrate
22 connection post
24 patterned metal layer
26 dielectric/dielectric layer
27 via
28 electrode
30 pixel circuit
30A pixel circuit
30B pixel circuit
32 LED contact pad
34 light-emitting diode
34R red light-emitting diode
34G green light-emitting diode
34B blue light-emitting diode
36 pixel substrate
38 control circuit
39 semiconductor substrate
40 wire
50 stamp
52 pillar
60 jumper source wafer 61 pixel source wafer
62 sacrificial portion
64 form
66 anchor
68 tether
69 broken tether
70 column direction
72 row direction
100 provide display substrate step
110 provide jumper source wafer step
120 provide complete circuit source wafer step
122 provide bare circuit source wafer step
124 provide LED source wafer step
126 micro-transfer print LEDs onto pixel substrates step
128 provide silicon source wafer step
129 micro-transfer print silicon circuits onto pixel substrates step
130 micro-transfer print electrical jumpers onto display substrate step
140 micro-transfer print circuits onto display substrate step

What is claimed:

1. A single metal layer sensor array, comprising:
a sensor substrate having a sensor surface with a sensor area;
a patterned metal layer disposed in or on the sensor substrate at least partially in the sensor area, the patterned metal layer at least partially exposed on the sensor surface;
wherein the patterned metal layer forms a two-dimensional array of spatially separated column line segments in the sensor area, each of the column line segments extending only partially across the sensor area in a column direction;
wherein the patterned metal layer forms a one-dimensional array of row lines extending across the sensor area in a row direction different from the column direction; and
wherein the row lines and column line segments are electrically separate in the patterned metal layer and in the sensor substrate;
a plurality of spatially separated electrical jumpers disposed in the sensor area on the sensor surface, each of the electrical jumpers electrically connected to two column line segments adjacent in the column direction to electrically connect the adjacent column line segments and form a one-dimensional array of electrically continuous column lines extending across the sensor area in the column direction, wherein each of the electrical jumpers comprises an independent jumper substrate independent of and separate from the sensor substrate and independent of and separate from the jumper substrate of any other electrical jumper, wherein the electrical jumpers in the plurality of spatially separated electrical jumpers are non-native to the sensor substrate; and
a plurality of spatially separated light-sensitive pixel circuits disposed in the sensor area on the sensor surface, each of the pixel circuits electrically connected to at least one row line of the array of row lines and one column line of the array of electrically continuous column lines.

2. The single metal layer sensor array of claim 1, wherein each of the pixel circuits comprises an independent pixel substrate separate from the sensor substrate and separate from the pixel substrate of any other pixel circuit.

3. The single metal layer sensor array of claim 2, wherein:
each of the pixel circuits comprises a semiconductor substrate different from the sensor substrate, separate from the pixel substrate of any other pixel circuit, and separate from the semiconductor substrate of any other pixel circuit;
the pixel circuit comprises a control circuit native to the semiconductor substrate; and
the semiconductor substrate is disposed on the pixel substrate.

4. The single metal layer sensor array of claim 3, wherein the pixel circuit comprises at least first and second wires formed on or in the pixel substrate, each of the semiconductor substrates comprises at least first and second connection posts, the first connection post is in electrical contact with the first wire, and the second connection post is in contact with the second wire.

5. The single metal layer sensor array of claim 2, wherein each of the pixel circuits comprises one or more light sensors that are disposed on the pixel substrate.

6. The single metal layer sensor array of claim 2, wherein the pixel substrate is a semiconductor substrate, the pixel circuit comprises a control circuit, and the control circuit is native to the semiconductor substrate.

7. The single metal layer sensor array of claim 2, wherein the pixel circuit comprises at least first and second wires formed on or in the pixel substrate and one or more light-sensing diodes, each of the one or more light-sensing diodes comprises a light-emitting structure electrically connected to at least first and second connection posts, the first connection post is in electrical contact with the first wire, and the second connection post is in contact with the second wire.

8. The single metal layer sensor array of claim 2, wherein each pixel substrate comprises at least row and column connection posts, the row connection post is in electrical contact with a row conductor and the column connection post is in contact with a column conductor segment.

9. The single metal layer sensor array of claim 2, wherein the pixel substrate and the jumper substrate are the same substrate.

10. The single metal layer sensor array of claim 1, wherein the patterned metal layer forms a plurality of one-dimensional arrays of row lines extending across the sensor area in the row direction and each of the pixel circuits is connected to one row line of each of the one-dimensional arrays of row lines.

11. The single metal layer sensor array of claim 10, wherein the row lines of one of the arrays of row lines are signal lines, the row lines of one of the arrays of row lines are power lines, the row lines of one of the arrays of row lines are ground lines, the row lines of one of the arrays of row lines are signal lines and the row lines of another, different one of the arrays of row lines are also signal lines, or any combination thereof.

12. The single metal layer sensor array of claim 1, wherein the patterned metal layer forms a plurality of two-dimensional arrays of spatially separated column line segments that extend only partially across the sensor area in the column direction, an electrical jumper electrically connected to each pair of column line segments adjacent in the column direction to electrically connect the adjacent column line segments and form a plurality of one-dimensional arrays of electrically continuous column lines extending across the sensor area in the column direction, and the pixel circuit is connected to one column line of each of the one-dimensional arrays of column lines.

13. The single metal layer sensor array of claim 12, wherein the column lines of one of the arrays of column lines are signal lines, the column lines of one of the arrays of column lines are power lines, the column lines of one of the arrays of column lines are ground lines, the column lines of one of the arrays of column lines are signal lines and the column lines of another, different one of the arrays of column lines are also signal lines, or any combination thereof.

14. The single metal layer sensor array of claim 1, comprising a column line extension electrically connected to the column line and extending in the row direction providing space on the sensor substrate for a plurality of redundant pixel circuits each connected to the same row line and the same column line or column line extension.

15. The single metal layer sensor array of claim 14, wherein one of the redundant pixel circuits is defective.

16. The single metal layer sensor array of claim 1, wherein each of the pixel circuits comprises one or more inorganic light-sensing diodes or each of the pixel circuits comprises one or more organic light-sensing diodes.

17. The single metal layer sensor array of claim 1, wherein each of the pixel circuits comprises two or more light-sensing diodes that each sense a different color of light or each of the pixel circuits comprises a red light sensor that senses red light, a green light sensor that senses green light, and a blue light sensor that senses blue light.

18. The single metal layer sensor array of claim 1, wherein the pixel circuits are passive circuits.

19. The single metal layer sensor array of claim 1, wherein (i) the pixel circuits are active circuits that each comprise at least one transistor (ii) the single metal layer sensor array is an active-matrix sensor array, or (iii) the pixel circuits are active circuits that each comprise at least one transistor and the single metal layer sensor array is an active-matrix sensor array.

20. The single metal layer sensor array of claim 1, wherein each of the electrical jumpers comprises at least first and second connection posts protruding from the jumper substrate, the first connection post in electrical contact with a first column line segment and the second connection post in electrical contact with a second column line segment adjacent to the first column line segment.

* * * * *